United States Patent

Koshimizu et al.

[11] Patent Number: 5,548,420
[45] Date of Patent: Aug. 20, 1996

[54] LIQUID-CRYSTAL DISPLAY DEVICE AND METHOD FOR BOTH DISPLAYING FAST MOVING IMAGES AND HOLDING STATIC IMAGES

[75] Inventors: Minoru Koshimizu; Takeo Kakinuma; Kensuke Ito, all of Kanagawa, Japan

[73] Assignee: Fuji Xerox Co., Ltd., Tokyo, Japan

[21] Appl. No.: 212,764

[22] Filed: Mar. 15, 1994

[30] Foreign Application Priority Data

Mar. 16, 1993 [JP] Japan .................................. 5-055568
Sep. 9, 1993 [JP] Japan .................................. 5-248650

[51] Int. Cl.⁶ ...................................................... G02F 1/13
[52] U.S. Cl. ............................... 359/44; 359/86; 359/90
[58] Field of Search ................................. 359/43, 44, 45, 359/90, 86

[56] References Cited

U.S. PATENT DOCUMENTS

| | | | |
|---|---|---|---|
| 5,140,448 | 8/1992 | Bone et al. | 359/44 |
| 5,157,525 | 10/1992 | Eaton et al. | 359/55 |
| 5,218,264 | 6/1993 | Hirai et al. | 313/384 |

FOREIGN PATENT DOCUMENTS

| | | |
|---|---|---|
| 58-501631 | 9/1983 | Japan . |
| 63-155022 | 6/1988 | Japan . |
| 63-501512 | 6/1988 | Japan . |
| 2-93432 | 4/1990 | Japan . |
| 3-155525 | 7/1991 | Japan . |
| 4-86618 | 3/1992 | Japan . |
| 4-94281 | 3/1992 | Japan . |
| 4-136821 | 5/1992 | Japan . |
| 4-130420 | 5/1992 | Japan . |
| 4-218021 | 8/1992 | Japan . |

OTHER PUBLICATIONS

"Controlling Formation of Liquid Crystal in Mixed Liquid Crystal–Polymer System by Optical Isomerization of Azobenzene Structure," Journal of the Chemical Society of Japan, No. 8, pp. 815–818, 1990 (no month).

Primary Examiner—Anita Pellman Gross
Assistant Examiner—James A. Dudek
Attorney, Agent, or Firm—Finnegan, Henderson, Farabow, Garrett & Dunner, L.L.P.

[57] ABSTRACT

Light-controlling layer which contains at least a liquid crystal as a component is combined with photoconductive layer that is provided on the side of the layer closer to exposing unit and the impedance of which varies in accordance with the intensity of input light. Exposing unit exposes the photoconductive layer to write image into the light-controlling layer. Gradation control unit modulates the output light of the exposing unit on the basis of a signal indicative of the multi-level density of the image to be written, thereby controlling the light transmittance of the light-controlling layer.

23 Claims, 11 Drawing Sheets

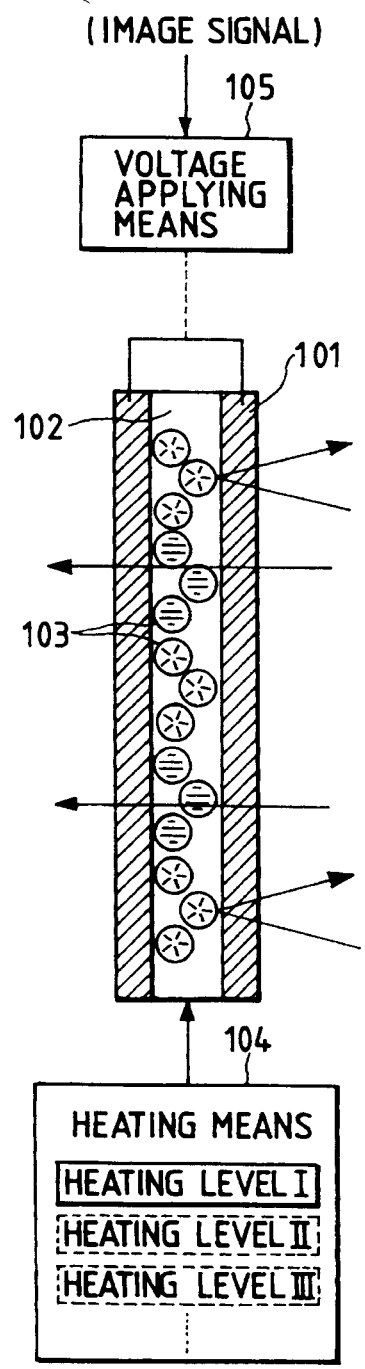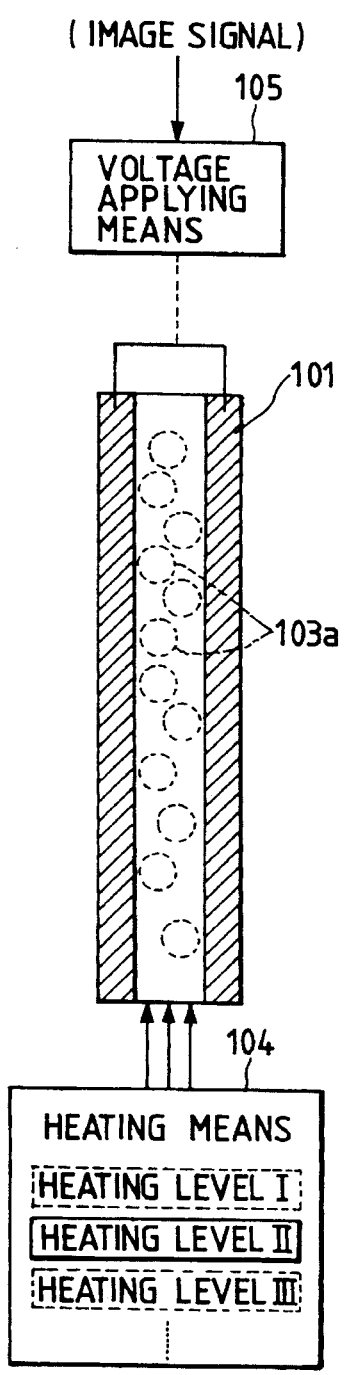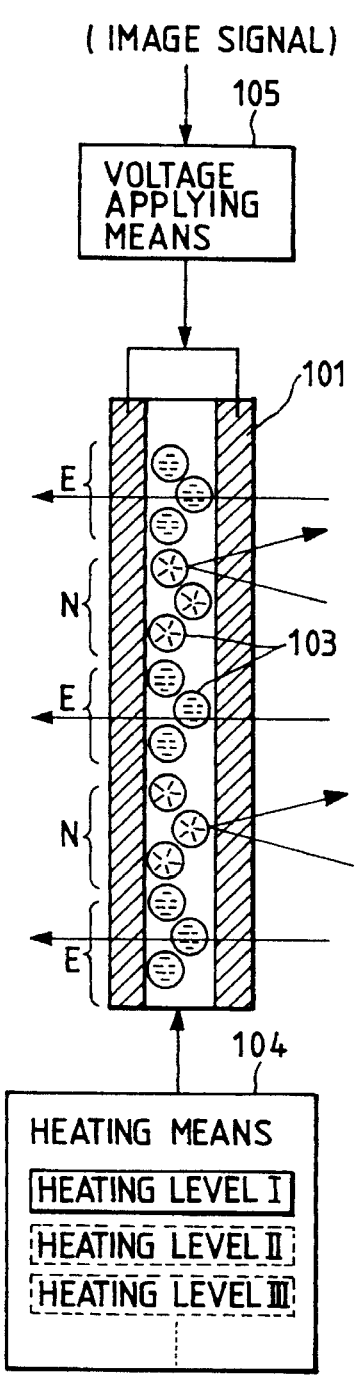

LIQUID-CRYSTAL DISPLAY DEVICE AND METHOD FOR BOTH DISPLAYING FAST MOVING IMAGES AND HOLDING STATIC IMAGES

BACKGROUND OF THE INVENTION

1. Field of the Invention

The present invention relates to a liquid-crystal display device, and more particularly to a liquid-crystal dependent, optical writing, liquid-crystal display and recording apparatus that may be used with recording systems, image display systems, image storage systems and any other systems that adopt reversible recording media. The present invention also relates to a method and apparatus for the display of liquid-crystal images that are capable of displaying fast moving images and which can still hold the displayed image without application of an electric field.

2. Discussion of the Related Art

Unexamined Published Japanese Patent Application (kokai) Nos. Hei 4-94281, 4-130420, 4-136821 and 4-218021 teach display devices that have a photoconductive layer and a light-controlling layer formed in superposition and in which, with an electric field being applied to both layers, the photoconductive layer is exposed on the basis of image information whereas the alignment of the liquid crystal in the light-controlling layer is controlled to write an image.

Let us describe individually the technical features of the inventions proposed by these patent applications. The invention proposed by Unexamined Published Japanese Patent Application (kokai) No. Hei 4-94281 aims at producing an image of high resolution at a low manufacturing cost; the invention proposed by Unexamined Published Japanese Patent Application (kokai) No. Hei 4-136821 has as a principal object the production of a high-resolution image with a multilayered structure of a dielectric mirror; the invention proposed by Unexamined Published Japanese Patent Application (kokai) No. Hei 4-218021 is such that a pulsed voltage of opposite polarity but of the same magnitude as in the writing mode is applied and, in synchronism with the applied voltage, a laser beam is emitted under completely identical conditions to those used in the writing mode, whereby the written information is partly erased leaving the necessary information intact.

With a view to improving the user interface, a demand has arisen recently to develop electronic devices that are oriented for friendliness to the human eye and greater ease in handling. In particular, electronic display devices are mostly used in operations for the primary purpose of drafting or displaying documents, and hence, it is desired to develop a display device that is capable of eye-friendly passive display, that has high reflective contrast and which satisfies two conditions, one for faster display and the other for the storage of display. Several display technologies have been proposed to date that satisfy part of these requirements. One known example of such technologies is a display device that makes use of the light scattering mode of a liquid crystal. In such a display device that operates in the light scattering mode, a liquid crystal is mixed with a transparent material having a substantially equal refractive index to the liquid crystal when it is aligned vertically and in order to align the liquid crystal either vertically or randomly, heat or an electric field is applied for controlling its alignment. In a display like this, light is transmitted when the liquid crystal is vertically aligned whereas in random alignment, light is scattered on account of the index difference and fails to be transmitted.

A materials technology to be used in display devices operating in the light scattering mode is taught by Japanese Patent Domestic Announcement (kohyo) No. Sho 58-501631 and U.S. Pat. No. 4,435,047; according to these references, an encapsulated liquid crystal is dispersed as crystal globules in a polymer, which is then processed into a film. According to the disclosed technology, the liquid crystal confined in capsules typically made of a polymer exhibits the nematic phase of positive dielectric anisotropy at the temperature of the environment of use; if the liquid crystal is placed in an electric field, the vector of its alignment becomes parallel to the field direction and the refractive index of the liquid crystal becomes equal to that of the polymer, whereupon the film turns transparent; if the electric field is removed, the molecules of the liquid crystal are aligned randomly and incident light is scattered at the interface between the liquid crystal and the capsule wall, whereby light transmission is blocked to produce turbid areas in the film for displaying the recorded information.

Japanese Patent Domestic Announcement (kohyo) No. Sho 63-501512 and Unexamined Published Japanese Patent Application (kokai) No. Sho 63-155022 propose that a liquid crystal exhibiting the smectic phase at an ordinary temperature be contained in a film to provide it with memory quality. If such materials are used, the written image can be held without power supply on account of the memory quality of the liquid crystal, and furthermore, the recording medium can be processed into a film, thereby making it possible to handle the display screen as if it were a hard copy.

An exemplary method of writing image with a display device using the above-described liquid-crystal materials is taught in Unexamined Published Japanese Patent Application (kokai) No. Sho 63-155022; according to this method, a voltage is applied to a binder layer containing microcapsules confining a smectic liquid crystal and the layer is heated with a thermal head that is driven in accordance with image information, whereupon the liquid crystal's alignment varied to control light in such a way that it is transmitted or not transmitted.

Unexamined Published Japanese Patent Application (kokai) No. Hei 3-155525 teaches an information recording medium that is composed of a photoconductive amorphous silicon layer in combination with a polymer-liquid crystal composite film that has a liquid crystal exhibiting the smectic phase at a room temperature dispersed in a polymer matrix; in this medium, an optical image is focused on the photoconductive layer and the polymer-liquid crystal composite film is provided with a field intensity distribution in accordance with the exposing pattern.

Further, Unexamined Published Japanese Patent Application (kokai) No. Hei 4-86618 teaches that a recording medium comprising a substrate that is deposited with a polymer-liquid crystal composite film having a liquid crystal dispersed in a polymeric material can provide continuous-tone display by controlling the intensity or area of heating.

The above-mentioned Unexamined Published Japanese Patent Application (kokai) Nos. 4-94281, 4-130420, 4-136821, 4- 218021 and 3-155525 make no disclosure of technologies on continuous-tone display.

The display devices disclosed in Unexamined Published Japanese Patent Application (kokai) Nos. Sho 63-155022 and Hei 4-86618 are incapable of fast rewriting of displays since the rewrite speed is determined by the rate of heat transfer. As a further problem, the production of continuous-tone display requires precise control of the intensity of heating; however, variations in the characteristic of heating elements present considerable difficulty in achieving correct control over a number of density levels.

Another display apparatus is proposed in Unexamined Published Japanese Patent Application (kokai) Hei 2-93432; a polymer-dispersed liquid crystal such that a liquid crystal exhibiting the nematic phase is dispersed irregularly in a polymeric material is loaded between a substrate and an opposing matrix electrode plate to fabricate a liquid-crystal display device and an electric field in accordance with image information is applied to the device via the matrix electrode, whereby the liquid crystal's alignment is controlled in such a way as to form light-transmitting or light-opaque areas, thereby effecting image display.

The liquid-crystal image display apparatus which is taught in Unexamined Published Japanese Patent Application (kokai) No. Sho 63-155022 is capable of holding the display screen since it uses a liquid crystal that exhibits the smectic phase having memory quality. However, the speed of rewriting the displayed image is limited by the heat transfer speed of the thermal head and, what is more, the thermal head or the liquid-crystal display medium has to be scanned in one direction to achieve image rewriting and, hence, image rewriting and display cannot be achieved as fast as can be done by ordinary electronic displays. Furthermore, the liquid-crystal display medium has such a structure that liquid-crystal globules having the liquid crystal of the smectic phase incorporated in microcapsules are dispersed in the polymer and, hence, an applied electric field will act upon the liquid crystal globules via the polymer and capsules. As a result, high drive voltage is required to cause a change in the arrangement of the molecules of the liquid crystal and, in addition, in order to hold the molecular arrangement of the liquid crystal in the smectic phase, the applied voltage (holding voltage) must not be lower than the level necessary to cause a change in the liquid crystal's molecular arrangement. This in turn causes a further disadvantage in that there is a potential hazard for failure due to current impression if a high voltage is applied to provide practical image memory quality or in that contrast is lowered if the thickness of liquid crystal layer is reduced in order to render it susceptible to the applied electric field.

The liquid-crystal image display apparatus disclosed in Unexamined Published Japanese Patent Application No. Hei 2- 93432 is capable of high-speed image rewriting since image has been written by applying electric field to a liquid crystal that assumes the nematic phase at ordinary temperatures; however, the liquid crystal per se has no memory quality and, hence, the display screen cannot be held.

To impart memory quality to this type of liquid-crystal display device, either one of the following methods may be employed. In the first method, a thermoplastic resin is used as the polymer and its capability for alignment is lost by first heating to a temperature not lower than its glass transition point and, then, with voltage being applied, the polymer is cooled slowly enough to impart alignability (see Japanese Patent Domestic Announcement (kohyo) No. Sho 63-501512). In the second method, an azo dye is incorporated in such a way that it is present at the interface between the polymer and the liquid crystal and cis-trans isomerization is controlled by exposure to visible light or uv radiation (see Onoki, Hayashi, Mizushima and Yamamoto, "Controlling the Formation of Liquid Crystal in Mixed Liquid Crystal-Polymer System by Optical Isomerization of Azobenzene Structure" in the Journal of the Chemical Society of Japan, No. 8, pp. 815–818, 1990). However, this method of controlling the liquid crystal's alignment with a view to imparting memory quality is very cumbersome. Yet, the result of this cumbersome operation is no more than simple memory quality.

Thus, there has been available no image display technology that has a dual characteristic in that image rewriting can be done at high speed and that the once written image can readily be retained. Under the circumstances, it has been desired to develop a liquid-crystal image display technology that is satisfactorily applicable to moving images.

SUMMARY OF THE INVENTION

An object, therefore, of the present invention is to provide a liquid-crystal display device that is capable of producing not only high-resolution displays but also correct continuous-tone displays.

Another object of the invention is to provide a method for displaying a liquid-crystal image with a passive display that utilizes the light scattering of a liquid crystal having high reflection contrast, which method is capable of not only effecting fast image rewriting but also retaining the written image if there is no need to rewrite it.

Still another object of the invention is to provide an apparatus for implementing the above-described method.

To attain the first object, the liquid-crystal display device of the present invention is furnished with a light-controlling layer containing at least a liquid crystal as a component, a photoconductive layer that is provided on one side of the light-controlling layer and the impedance of which varies in response to the light received, voltage applying means for applying voltage to the light-controlling layer and the photoconductive layer, exposing means for writing an image in the light-controlling layer by exposure of the photoconductive layer, and gradation control means for controlling the light transmittance of the light-controlling layer by modulating the output light from the exposing means on the basis of a signal indicative of the multi-level density of the image.

The liquid-crystal display device of the present invention which has the construction just described above is operated in the following manner. First, both the light-controlling layer that contains a liquid crystal as a component and which has been rendered to scatter light from the entire surface, as well as the photoconductive layer are supplied with a voltage by the voltage applying means. The output light from the exposing means is modulated by the gradation control means on the basis of the multi-level density of the image to be written. The modulated output light illuminates the photoconductive layer and the illuminated region of the photoconductive layer has its impedance and, hence, conductivity, varied in accordance with the factor of modulation of the output light from the exposing means and the voltage from the voltage applying means is accordingly applied to the light-controlling layer, whereupon the light transmittance of the light-controlling layers, namely, the density level is determined in accordance with the applied voltage. On the other hand, the unilluminated region of the photoconductive layer remains high in impedance and, hence, low in conductivity; since little voltage is applied to the light-controlling layer, it maintains the initial light scattering state. This is how an image having multi-level densities is written into the light-controlling layer.

The second object of the present invention can be attained by a method of displaying a liquid-crystal image using as a liquid-crystal display device a liquid crystal-polymer composite film in which a liquid crystal that exhibits the smectic A phase at the temperature of the environment of use and which makes a transition to the nematic phase at a higher temperature is dispersed in a polymeric resin, further characterized in that in the image display mode, the liquid crystal in said liquid crystal-polymer composite film is held in the smectic A phase as it is heated by a heating means at a temperature higher than the temperature of the environment of use but lower than the temperature for the transition to the nematic phase whereas, in the image rewrite mode, the same heating means is used to heat the liquid crystal at a temperature higher than the temperature for the transition to the nematic phase and, at the point of time when a transition to the nematic phase occurs, an electric field comprising a pattern in accordance with moving image information is applied by an electric field applying means so as to control the state of the liquid crystal's alignment.

The third object of the present invention can be attained by an apparatus for displaying a liquid-crystal image which comprises: an electric field applying means for applying an electric field comprising a pattern in accordance with moving information; a liquid-crystal display device furnished with a liquid crystal-polymer composite film in which the state of the liquid crystal's alignment is controlled in accordance with the applied electric field and in which a liquid crystal that exhibits the smectic A phase at the temperature of the environment of use and which makes a transition to the nematic phase at a higher temperature is dispersed in a polymeric resin; and a heating means that can be set at a plurality of heating levels capable of heating the liquid crystal in said liquid crystal-polymer composite film to a temperature profile including a temperature higher than the temperature of the environment of use but lower than the temperature for the transition to the nematic phase, as well as a temperature higher than said temperature for the transition to the nematic phase.

The various phases of the liquid crystal in the liquid crystal-polymer composite film can be recognized by detection with a suitable device such as an optical sensor that makes use of the difference in the optical characteristic of the composite film (whether it is transparent or opaque) or a thermal sensor that measures directly the temperature of the composite film. It should particularly be noted that since image rewriting is effected when the liquid crystal in the composite film assumes the nematic phase, it is necessary to insure the proper timing of the rewrite operation by detecting the correct point of time when the liquid crystal assumes the nematic phase.

In a specific embodiment of the apparatus for image display, the heating means is such that it can be set to at least two heating levels, one being for heating to a temperature higher than the temperature of the environment of use at which the liquid crystal in the liquid crystal-polymer composite film exhibits the smectic A phase and the other being for heating to the temperature at which said liquid crystal is once liquefied. In a specific embodiment of the method for image display, image rewriting is effected at the point of time when the liquid crystal in the liquid crystal-polymer composite film that has been once liquefied as a result of heating by the heating means is cooled by itself to cause a transition to the nematic phase. The advantage of heating at more than one level by the heating means is that faster image rewriting can be done and that satisfactory image erasure can be accomplished without producing an afterimage.

In another embodiment of the apparatus for image display, the heating means may be such that it is furnished with a heating electrode that is provided in contact with the liquid crystal-polymer composite film. If this heating means is used to perform heating with an electric current being applied to the heating electrode, highly efficient heat transfer is achieved and the liquid crystal-polymer composite film can be heated at a sufficiently high speed to enable faster image rewriting.

In yet another embodiment of the apparatus for image display, the heating means may be such that the heating electrode also serves as the electric field applying means. The advantage of using such heating means is that the construction of the electrodes in the liquid-crystal display device is made simple enough to permit reduction in the size or thickness of the apparatus and even to realize a lower manufacturing cost.

In a further embodiment of the apparatus for image display, the heating means may be such that it has a heating level switching means capable of setting a plurality of heating levels by adjusting at least one of the following parameters of the current pulses to be applied to the heating electrode: the part value, the pulse width and the number of pulses. If heating levels are set by varying the peak value of current pulses and if they are selectively switched in an appropriate manner, the heating level can always be switched at a constant speed. If heating levels are set by varying the pulse width of current pulses or their number and if they are selectively switched in an appropriate manner, fine control of the heating levels can be accomplished. It should be noted here that the setting of heating levels is in no way limited to the case where the respective parameters (i.e., the peak value of current pulses, the pulse width and the number of pulses) are varied individually; it is also possible to set heating levels by varying two or more of these parameters at the same time.

In the present invention, the liquid-crystal display device may be of such a type that it is adapted for image writing by applying an electric field in accordance with an optical image that is based on image information.

Stated more specifically, the liquid-crystal display device to be used in the present invention may have such a structure that a photoconductive layer and a light-shielding layer, both serving as an electric field applying means, and a liquid crystal-polymer composite film are placed in superposition in that order between two transparent film substrates each having a transparent electrode formed on the inner surface. In this case, the heating electrode as the heating means may be provided in a separate step by superposing it on the transparent film substrate closer to the liquid crystal-polymer composite film; it should, however, be noted that the transparent electrode on the transparent film substrate closer to the composite film is preferably used as a member that also serves as the heating electrode. When fabricating a liquid-crystal display device of this construction, an optical image writing unit that performs image writing with a laser beam or the like being applied in accordance with image information is provided on the side closer to the photoconductive layer. By illuminating the photoconductive layer with the laser beam from the optical image writing unit, an electric field is generated in the illuminated area and the liquid crystal's alignment is controlled accordingly to effect image writing.

If the display device is constructed in this manner, an image of high resolution can be written. The photoconductive layer to be used in this construction may be of any type that has such a photoconductive characteristic that rapid impedance changes will develop in response to the intensity of illuminating light. In an optimal case, the photoconductive layer may be formed of an inorganic or organic material that has such a homogeneous single-layer structure that it has a bipolar photoconductive characteristic.

Alternatively, the liquid-crystal display device may be of such a structure that a liquid crystal-polymer composite film is sandwiched between two transparent film substrates that are each furnished with a matrix electrode having an array of two-dimensional pixel driving elements and in which at least one of the two transparent film substrates is added as an electric field applying electrode so that it can also serve as the heating electrode. In this type of liquid-crystal display device, the matrix electrodes may be supplied with an electric current in accordance with image information, whereby an electric field develops in the energized area and the liquid crystal's alignment is controlled accordingly to effect image writing.

If the display device is constructed in this manner, there is no need to use an optical image writing unit of the type that is employed in the first case of liquid-crystal display device and, hence, a compact apparatus can be realized.

BRIEF DESCRIPTION OF THE DRAWINGS

The above and other objects and features of the present invention will be more apparent from the following description taken in conjunction with the accompanying drawings.

FIGS. 9(a), 9(b) and 9(c) are diagrams for illustrating the method and apparatus of the present invention for displaying a liquid-crystal image, as well as the operating theory of the method;

DETAILED DESCRIPTION OF THE PREFERRED EMBODIMENTS

Figure 1:
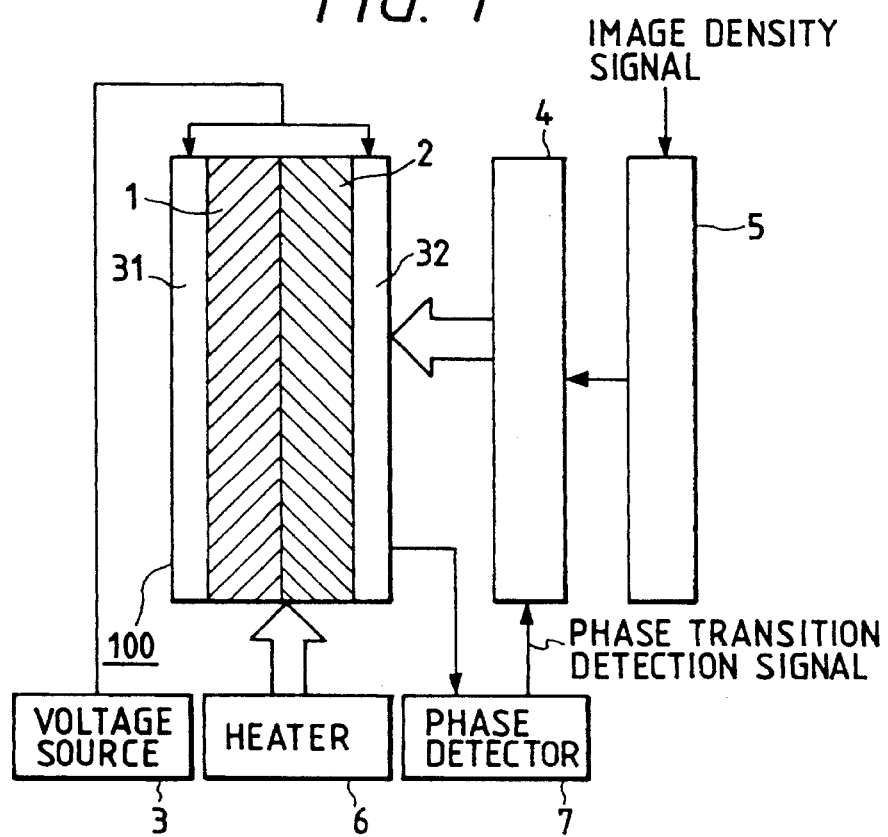
FIG. 1 is a diagram showing the layout of an example of the liquid-crystal display device of the present invention.

FIG. 1 shows an example of the liquid-crystal display device of the present invention. The example refers to the case where the present invention is applied to an optical writing liquid-crystal display device.

Shown by numeral 1 is a light-controlling layer that is composed of a polymer-liquid crystal film having a liquid crystal dispersed in a polymeric resin. The liquid crystal and polymeric resin in the polymer-liquid crystal composite film are desirably coupled in a three-dimensional manner, with the liquid crystal being dispersed substantially uniformly in the polymeric resin, for the purpose of producing intense light scattering and low drive voltage. In the example under consideration, the liquid crystal contained in the polymer-liquid crystal composite film is such that the smectic A phase is exhibited at the temperature of the environment of use (e.g., 0° to 40° C. with the average being assumed to be 25° C.) whereas a transition to the nematic phase occurs at a higher temperature.

A photoconductive layer 2 the impedance of which varies upon receiving light is provided on one side of the light-controlling layer 1. The photoconductive layer 2 is characterized by being formed in such a way that it generates both electrons and holes as carriers to be excited by exposure and that the generated carriers can migrate through the layer. The photoconductive layer 2 is most preferably made of hydrogenated amorphous silicon since it contains no toxic components and permits fast response.

Electrodes 31 and 32 are provided in such a way as to sandwich the light-controlling layer 1 and the photoconductive layer 2. The electrode 31 which is transparent is provided on one side of the light-controlling layer 1 that is remote from the photoconductive layer 2, whereas the electrode 32 which is also transparent is provided on one side of the photoconductive layer 2 that is remote from the light-controlling layer 1. The electrodes 31 and 32 are desirably formed of ITO (indium tin oxide). The light-controlling layer 1, photoconductive layer 2, as well as electrodes 31 and 32 constitute a display recording medium 100.

A voltage source 3 applies voltage to the light-controlling layer 1 and the photoconductive layer 2 via transparent electrodes 31 and 32. An exposing unit 4 is a device for writing image data into the light-controlling layer 1 by exposing the photoconductive layer 2 on a pixel basis through the transparent electrode 32.

A gradation control unit 5 controls the light transmittance of the light-controlling layer 1 by modulating the time of exposure, per pixel, to the light applied from the exposing unit 4 to the photoconductive layer 2 on the basis of an image density signal which indicates the multi-level density of the image to be written into the light-controlling layer 1.

A heater 6, which is typically composed of electrodes for heating the light-controlling layer 1, heats the light-controlling layer 1 (i.e., the polymer-liquid crystal composite film) to a temperature higher than the temperature of the environment of use, whereby the phase of the liquid crystal in o the light-controlling layer 1 turns liquid. A phase transition detector 7 detects that the liquid crystal in the light-controlling layer 1 has made a transition from the liquid to the nematic phase and outputs a phase transition detection signal accordingly.

Let us describe the operation of the liquid-crystal device shown in FIG. 1 which is constructed in the manner described above. First, the light-controlling layer 1 which has been rendered to scatter light from the entire surface, as well as the photoconductive layer 2 are supplied with voltage from the voltage source 3 via the transparent electrodes 31 and 32. The photoconductive layer 2 is illuminated with light from the exposing unit 4 that has been modulated in exposure time by means of the gradation control unit 5 on the basis of the information that is given by the image density signal to indicate the multi-level density of the image to be written. As a result, the exposed region of the photoconductive layer 2 undergoes a change in conductivity in accordance with the degree of modulation and a corresponding amount of voltage is applied to the light-controlling layer 1, whereby its transparency, or density level, is determined in accordance with the intensity of the voltage being applied. On the other hand, the unexposed region of the photoconductive layer 2 remains low in conductivity and the corresponding area of the light-controlling layer 1 is supplied with a negligibly small amount of voltage, thus being kept in the initial light scattering state. This is how an image having the multi-level density indicated by the image density signal is written into the light-controlling layer 1.

The light-controlling layer 1 used in the example under consideration is such that a liquid crystal that exhibits the smectic A phase at the temperature of the environment of use, with the liquid crystal making a transition to the nematic phase at a higher temperature, is dispersed in a polymeric resin. In a case like this, the liquid crystal is first heated by the heater 6 at least to the temperature where a transition to the liquid phase occurs and then the liquid crystal is cooled to ordinary temperatures, whereby the light-controlling layer 1 is rendered to scatter light from its surface. During cooling, the phase detector 7 detects that the liquid crystal in the light-controlling layer 1 has made a transition from the liquid to the nematic phase, whereupon it outputs a phase transition detection signal. In response to this detection signal, the exposing unit 4 performs exposure on the photoconductive layer 2. As already mentioned, the exposing light is controlled by the gradation control unit 5 in terms of density level on the basis of the multi-level density information. Thus, if there is no need to perform image o rewriting, the light-controlling layer 1 exhibiting a continuous-tone image is cooled from the nematic phase exhibiting state to the smectic A phase exhibiting phase as it carries the image, whereby the image of interest can be held in the absence of applied voltage.

According to the example of the present invention illustrated in FIG. 1, the output light from the exposing unit 4 is modulated with the gradation control unit 5 on the basis of the information about the density level of the image to be written, whereby the transition of light through the light-controlling layer 1 is controlled appropriately to accomplish the production of correct continuous-tone displays. Further, the impedance of the photoconductive layer 2 is varied in accordance with the factor of modulation of the output light from the exposing unit 4 and a corresponding amount of voltage is applied to the light-controlling layer 1, whereby displays of high resolution can be produced.

As another advantage, the light-controlling layer 1 which is formed of the polymer-liquid crystal composite film that has a liquid crystal dispersed in a polymeric resin can be rendered lighter in weight and flexible.

Furthermore, the liquid crystal to be contained in the light-controlling layer 1 is such that the smectic A phase is exhibited at the temperature of the environment of use and that its phase makes a transition to the nematic phase at a higher temperature. Hence, image can be written or rewritten by performing image writing at the time when the liquid crystal is assuming the nematic phase; in addition, the liquid crystal assumes the smectic phase having memory quality at the temperature of the environment of use and this insures that the last written image can be held in the absence of power supply.

In the example under consideration, the gradation control unit 5 controls the exposure time for each of the pixels in the photoconductive layer 2 on the basis of multi-level density information and this enables the gradation to be controlled with good linearity at high speed.

Further, the heater 6 heats the light-controlling layer 1 until the liquid crystal it contains turns liquid, so an image can be written at the time when the liquid crystal assumes the nematic phase and this contributes to a lower drive voltage in the writing mode.

Another advantage is that the photoconductive layer 2 is exposed in response to a detection signal which indicates that the liquid crystal in the light-controlling layer 1 has made a transition from the liquid to the nematic phase and, hence, image can positively be written into the light-controlling layer 1 when the liquid phase assumes the nematic phase.

Figure 2:
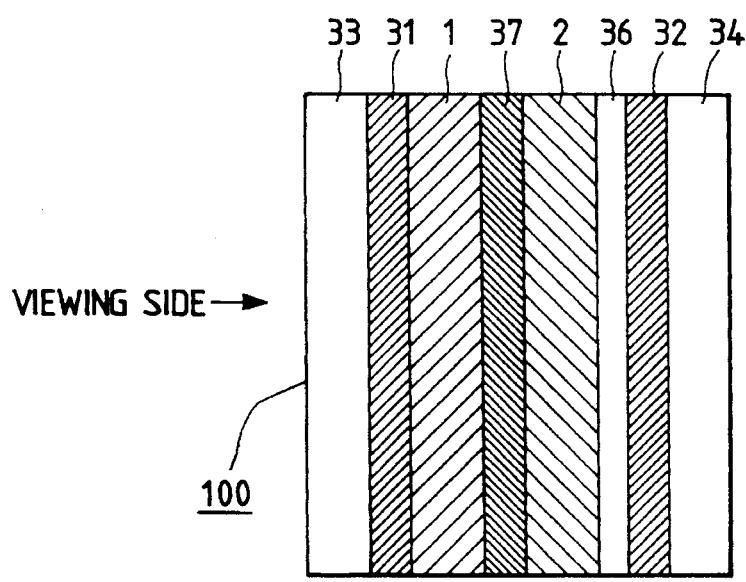
FIG. 2 is a cross-sectional view showing a specific construction of a liquid-crystal display recording medium indicated by 100 in FIG. 1.

FIG. 2 shows in detail an example of the construction of the display recording medium 100 which is shown in FIG. 1. First, transparent electrode 32 which is made of indium tin oxide (ITO) is formed on a transparent polyimide substrate 34 by sputtering. The electrode 32 is overlaid with a carrier injection blocking layer 36 that is formed of TaOx in a thickness of 0.1 µm to prevent the injection of carriers from the electrode into a photoconductive layer. The blocking layer 36 in turn is overlaid with a photoconductive hydrogenated amorphous silicon layer 2 that is formed in a thickness of 5 µm by a plasma-assisted CVD technique using as a starting material a mixture of silane and hydrogen gases that is doped with a small amount of boron. The photoconductive layer 2 is overlaid with a carrier injection blocking CdTe film 37 in a thickness of 0.1 µm which also serves as a light-shielding layer. The inherent function of the layer 37 is to absorb the light to which the photoconductive layer 2 is sensitive but it also functions as a light-absorbing layer that is capable of producing a satisfactory direct-viewing, black-and-white reflective display which comprises black characters against a white background.

The liquid crystal in the light-controlling layer 1 is made of a cyanobiphenyl containing smectic liquid-crystal mixture (e.g., "S2" of BDH Corp.). This liquid-crystal material (80 wt %) is blended with a polymerizable composition consisting of 11.6 wt % of 1,6-hexanediol diacrylate ("KAYARAD HDDA" of Nippon Kayaku Co., Ltd.) and 8 wt % of a urethane acrylate oligomer ("EVECURYL 204" of Daicel UCB Co., Ltd.) as compounds to be polymerized, as well as 0.4 wt % of 2-hydroxy-2-methyl-1-phenylpropane-1-one ("DAROCURE 1173" of Merck Japan Co., Ltd.) as a polymerization initiator. To the blend, spacer balls with a diameter of 10 µm ("MICROPEARL SP210" of Sekisui Fine Chemical Co., Ltd.) were added in a small amount and the respective components were mixed in an ultrasonic cleaner, followed by degassing to prepare a mixed solution. The mixed solution was held between the carrier injection blocking layer 37 formed on the side closer to transparent substrate 34 in the manner described above and transparent ITO electrode 31 which is formed on transparent substrate 33 that is made of a PET (polyethylene terephthalate) film; the assembly is held at 25° C. while it is cured by uniform exposure for a few seconds to an ultraviolet radiation ($\lambda \cong 360$ nm) from a black lamp as a light source.

The carrier injection blocking layers 36 and 37 which are provided on opposite sides of the photoconductive layer 2 as shown in FIG. 2 and as described above are capable of preventing the injection of carriers into the photoconductive layer 2, thereby suppressing the flow of a dark current to a sufficiently low level to maintain a satisfactory image contrast and resolution.

Further, the light-shielding layer 37 which absorbs the light to which the photoconductive layer 2 has sensitivity is provided between the light-controlling layer 1 and the photoconductive layer 2 and this prevents the leakage of the writing light from the photoconductive layer 1 to enter the light-controlling layer 1, thereby assuring utmost safety to the eye of an operator who is looking at the displayed image. The example illustrated in FIGS. 1 and 2 assumes the case where black characters (black is the color of the layer below the light-controlling layer 1 that has become transparent) are displayed reflectively against the white background (the light-scattering region) and satisfactory reflective display can be produced since the light-shielding layer 37 also serves as the light-absorbing layer as seen from the viewing side (transparent substrate 33).

Since the layer 37 works as both the carrier injection blocking layer and the light-shielding layer, not only can the construction of the display recording medium 100 be simplified but its manufacturing cost can also be reduced.

As a further advantage, the photoconductive layer 2 which is made of hydrogenated amorphous silicon generates both electrons and holes as carriers upon excitation by exposure and the generated carriers are capable of migration through the layer 2; hence, there will be no great increase in the number of residual charges and the generation of space charges which would otherwise cause an afterimage is also limited. In addition, only a low drive voltage need be applied to assure that the light-controlling layer 1 is rendered sufficiently light-transparent and that, at the same time, the device can be operated on an ac current while effectively suppressing the flow of a dc component which will deteriorate the liquid crystal in the light-controlling layer 1.

Figure 3:
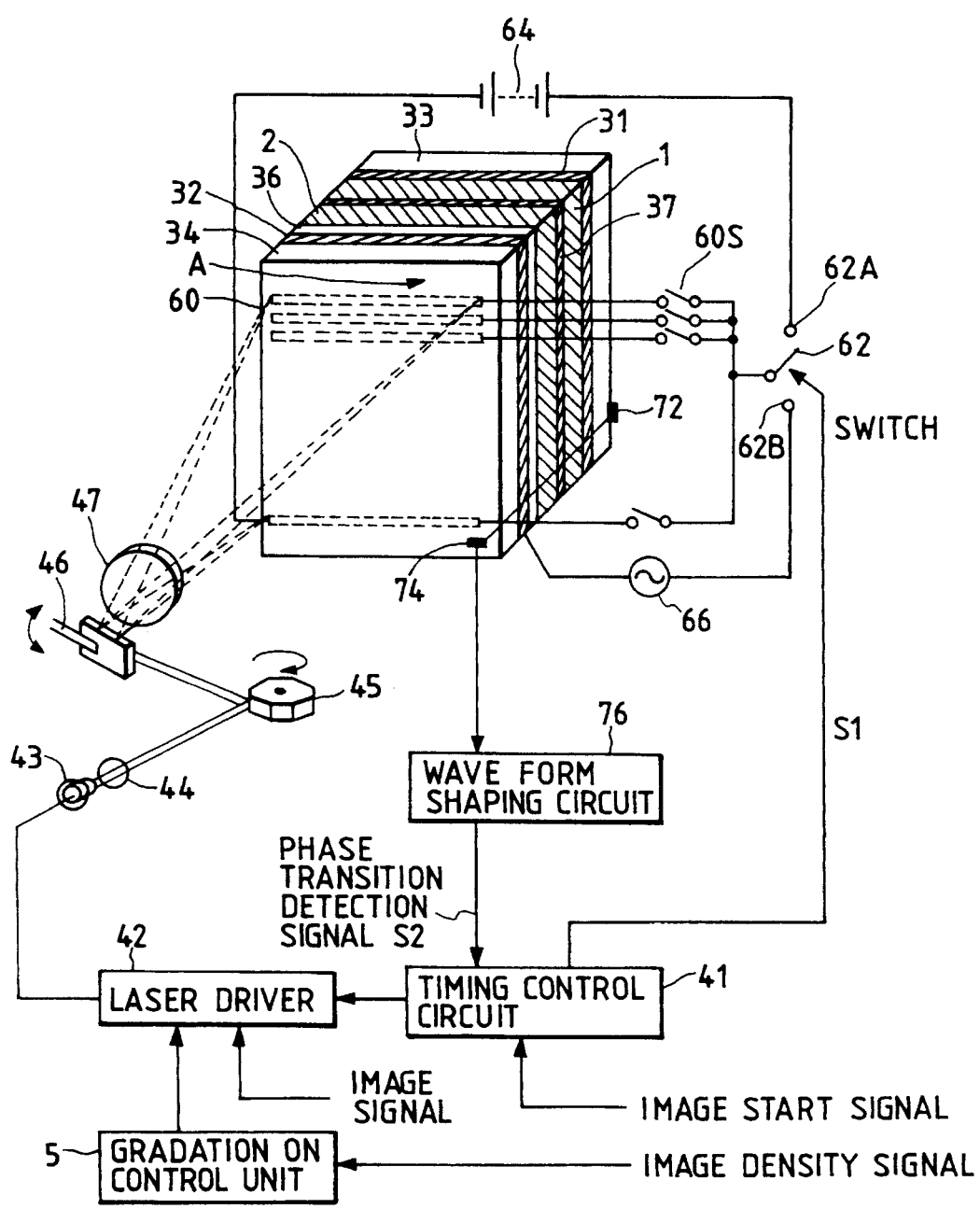
FIG. 3 is a diagram showing a specific layout of the example of the liquid-crystal display device of the present invention which is shown in FIG. 1.

FIG. 3 shows a specific layout of an apparatus implementing the example of the present invention shown in FIGS. 1 and 2. In the case shown in FIG. 3, the exposing unit 4 shown in FIG. 1 comprises: a laser driver 42 that starts to operate in response to an exposure start signal from a timing control circuit 41 and which outputs a laser drive signal in response to an image signal and an exposure time control signal from the gradation control unit 5; a semiconductor laser 43 that issues a laser beam at a wavelength of, say, 690 nm in response to a laser drive signal; a collimator lens 44 for collimating the laser beam issuing from the semiconductor laser 43; a polygonal mirror 45 that is rotated with a drive unit (not shown) and which deflects the laser beam through the lens 44 to move in the main scan direction of the display recording medium 100, namely in the direction indicated by arrow A in FIG. 3; a galvanometer mirror 46 that is pivoted by a drive unit (not shown) and which deflects the laser beam from the polygonal mirror 45 to move in the sub-scan direction (perpendicular to the main scan direction) of the display recording medium 100; and f$\theta$ focusing optics 47 by which the laser beam reflected form the mirror 46 is focused as a spot of light that is sent to the display recording medium 100.

In the specific case shown in FIG. 3, the heater 6 shown in FIG. 1 comprises: a plurality of heating electrodes 60 that each have a width of, say, 200 μm and which are strips spaced apart at intervals of, say, 230 μm on the surface of the transparent substrate 34 that is remote from the transparent electrode 32; a plurality of switches 60S that are connected in series to the respective heating electrodes 60; and a dc voltage source 64 that is connected in parallel via a switch 62 to the series circuit formed of the heating electrodes 60 and the switches 60S. The switches 60S are controlled with a control unit (not shown) in such a way that they will turn on just before actual scanning is effected in synchronism with the scanning of the display recording medium 100 by the laser beam.

In the specific case shown in FIG. 3, the phase transition detector 7 shown in FIG. 1 comprises a light-emitting device 72 and a light-receiving element 74 that are provided in such a manner that they hold therebetween the non-image display region of the display recording medium 100 which is not supplied with voltage from the transparent electrodes 31 and 32, as well as a waveform shaping circuit 76 with which the waveform of an output signal from the light-receiving element 74 is shaped to a pulsed signal that rises and falls abruptly. The waveform shaping circuit 76 may typically comprise a comparator that outputs a "H" signal when the level of an output signal form the light-receiving element 74 is greater than a threshold while outputting a "L" signal when the level of the output signal is smaller than the threshold. As long as the liquid crystal in the light-controlling layer 1 assumes the liquid phase and the layer 1 remains transparent, the light-receiving element 74 keeps receiving light from the light-emitting element 72. Suppose here that the liquid crystal cools by itself to make a transition from the liquid to the nematic phase; as already mentioned, no electric field is applied to the liquid crystal in the region between the light-emitting element 72 and the light-receiving element 74 and, hence, the liquid crystal's alignment is disrupted to cause light scattering, whereupon the light-receiving element 74 will no longer receive the light from the light-emitting element 72. As a result, the level of the output signal from the light-receiving element 74 will drop and, accordingly, the output of the waveform shaping circuit 76 will change from the "H" to "L" level.

The switch 62 has two terminals 62A and 62B; the dc voltage source 64 is connected to terminal 62A and one of the two terminals of an ac voltage source 66 is connected to terminal 62B. The other terminal of the ac voltage source 66 is connected to the transparent electrode 32. Upon receiving a signal S1 from the timing control circuit 41 to start the preparation for image rewriting, the contact of switch 62 is connected to terminal 62A so that heating pulses can be supplied from the dc voltage source 64 to the heating electrodes 60 via switches 60S. The switch 62 is also designed in such a way that, upon receiving a switch select signal from the timing control circuit 41, the contact is connected to terminal 62B so that an ac voltage as supplied from the ac voltage source 66A can be applied between the transparent electrodes 31 and 32. The timing control circuit 41 outputs the switch select signal if it receives from the waveform shaping circuit 76 a phase transition detection signal S2 that indicates the fact that the liquid crystal in the light-controlling layer 1 has made a transition from the liquid to the nematic phase.

Figure 4:
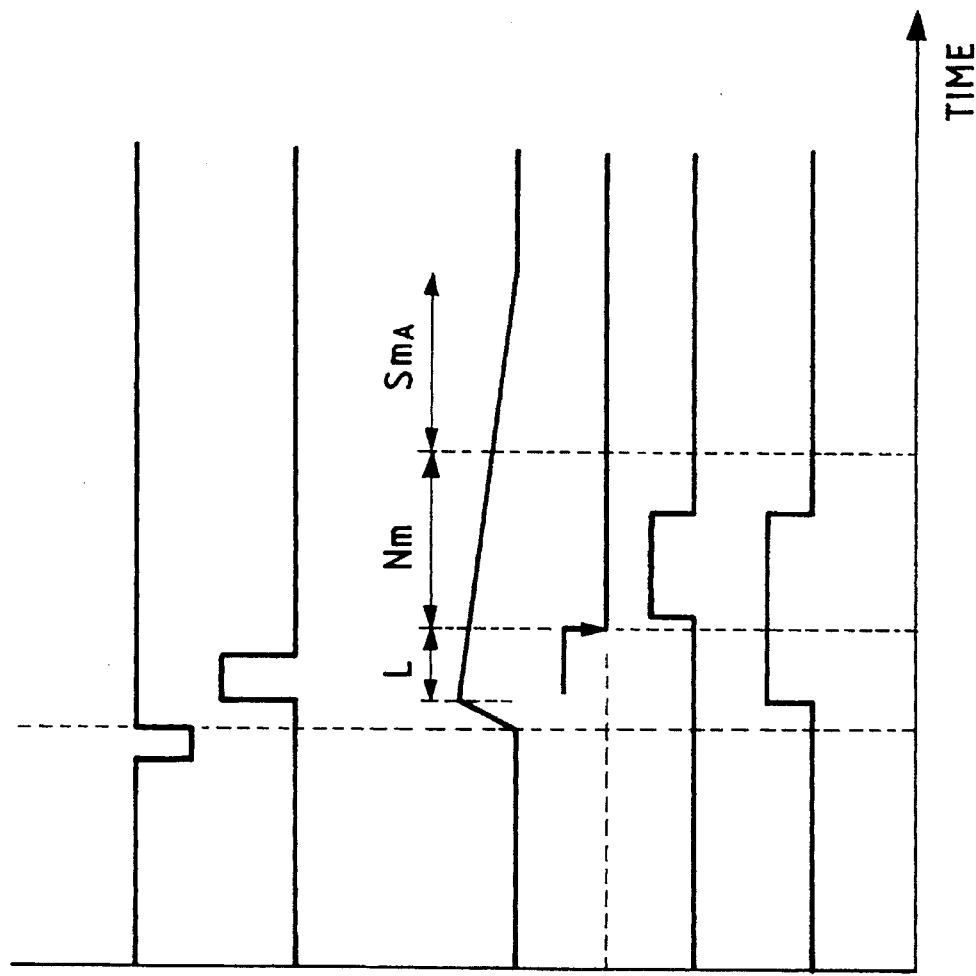
FIG. 4 is a timing chart showing the timed relationships in the operation of the specific example shown in FIG. 3.

FIG. 4 is a timing chart showing the timed relationships in the operation of image rewriting when implementing the optical writing liquid-crystal display recording device of the present invention as it is illustrated in FIG. 3. We describe below the operation of the device of FIG. 3 with particular reference to FIG. 4. To begin with, in response to the image start signal, the timing control circuit 41 outputs the signal S1 for starting the preparation of image rewriting just before image is actually rewritten into the display recording medium 100. Receiving the signal S1, the switch 62 has its contact connected to the terminal 62A. Thereafter, a control circuit (not shown) will turn on the switches 60S before the laser beam scans the regions where the respective heating electrodes 60 corresponding to those switches are provided. As a result, the heating electrodes 60 will be supplied with dc current pulses from the dc voltage source 64. The applied current pulses each have a width of, say, about 10 ms.

A specified time after the outputting of the signal S1 (namely, just after the supply of electric pulses to the heating electrodes 60), the timing control circuit 41 will supply a switch select signal to the switch 62 which, in turn, has its contact connected to terminal 62B. As a result, the ac voltage source 66 will supply an ac voltage between the transparent electrodes 31 and 32 in the display recording media 100 in an amount (say, 30 V rms) sufficient to align the liquid crystal in the light-controlling layer 1. It should, however, be noted that this voltage will not be imposed on the light-controlling layer before the photoconductive layer 2 is exposed.

The liquid crystal is first liquefied by the Joule heat of the heating current pulses and then makes a transition to the nematic phase. In response to this phase transition, the output of the waveform shaping circuit 76 will change from a "H" to "L" level. Thus, the waveform shaping circuit 76 will output a phase transition detection signal S2. In response to the detection signal S2, the timing control circuit 41 will output an exposure start signal, whereupon exposure of the photoconductive layer 2 is started in accordance with the image density information. Exposure of the photoconductive layer 2 is performed by the following procedure: the laser driver 42 outputs a laser drive signal in accordance with the exposure time control signal from the gradation control unit 5; the semiconductor laser 43 issues a laser beam in accordance with the laser drive signal; the beam issued from the laser 43 is collimated by the collimator 44 and deflected two-dimensionally by the polygonal mirror 45 and galvanometer mirror 46; and the deflected beam is focused as a spot by means of the fθ focusing optics 47.

In the process of exposure, the laser driver 42 is subjected to on-off control over light emission in accordance with an image signal while, at the same time, it is subjected to the modulation of emission time by the gradation control unit 5 on the basis of an image density signal. The electrodes 31 and 32 between which the light-controlling layer 1 and the photoconductive layer 2 are held are preliminarily supplied with a specified ac voltage, so in response to the exposure, a voltage pattern of a pulse width as determined by the density information will momentarily be applied to the light-controlling layer 1.

The timing control circuit 41 will output the above-described switch select signal and exposure start signal so that the application of voltage to the display recording medium 100 and the exposure of the photoconductive layer 2 will end before the liquid crystal makes a transition from the nematic to the smectic phase. In the case of cyclic image rewriting, the operation described above will be performed continuously and, in the absence of image switching, the liquid crystal assumes the smectic A phase which has memory quality at ordinary temperatures and, hence, the last written image is retained in the absence of a power supply. In the case of the liquid-crystal material "S2", the transition from the smectic phase A to the nematic phase occurs at the temperature 48° C. ($S_A$–N point) whereas the transition from the nematic to the liquid phase occurs at 49° C. (N–I point).

Figure 5:
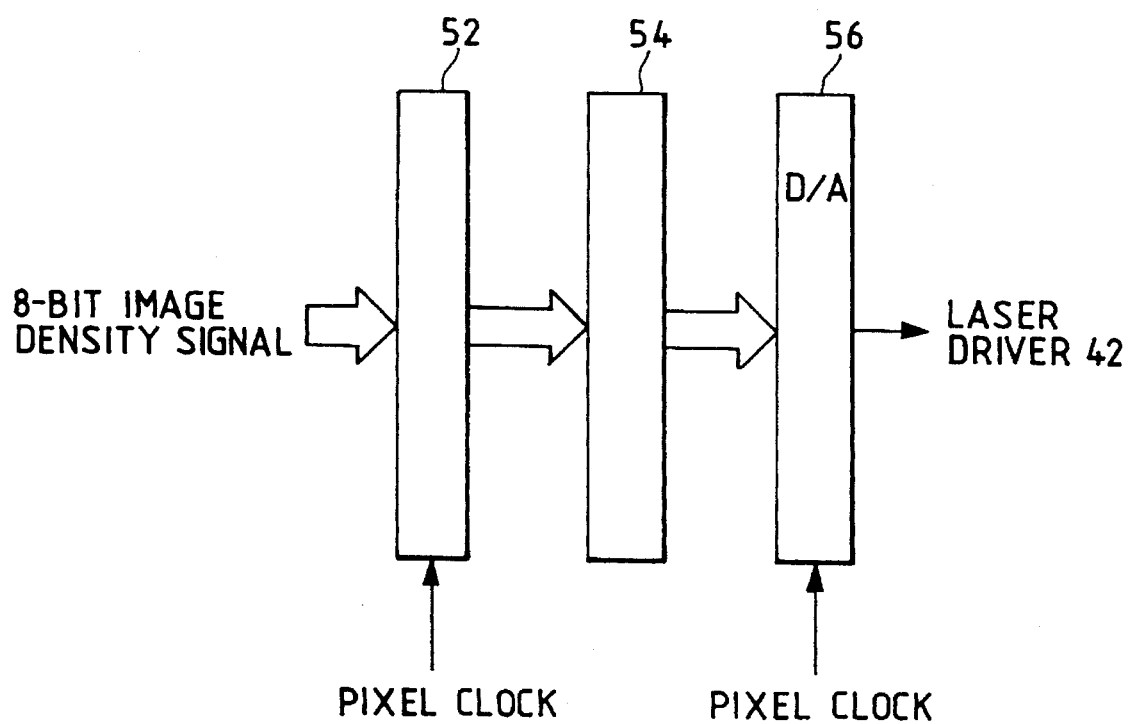
FIG. 5 is a block diagram showing an example of the composition of a gradation control unit that is indicated by 5 in FIGS. 1 and 3.

FIG. 5 shows a specific layout of the gradation control unit 5 shown in FIGS. 1 and 3. The gradation control unit shown in FIG. 5 comprises: a latch circuit 52 with which an image density signal that is a digital signal representing, say, 256 density levels in 8 bits is held in accordance with a pixel clock; a look-up table 54 that corrects the time of voltage application to the light-controlling layer 1 in accordance with the nonlinearity of the light transmittance of the layer 1, that stores the corrected value in the form of a digital signal as it is related to multi-level density, and which outputs a signal indicative of the voltage application time in association with the image density signal stored in the latch circuit 52; and a D/A converter 56 with which the output signal from the look-up table 54 that is indicative of the voltage application time is converted to an analog signal indicative of a 256-level emission pulse width in accordance with the pixel clock.

The gradation control unit 5 whose specific layout is shown in FIG. 5 will operate as follows. First, the 8-bit (256-level) image density signal is latched in the latch circuit 52 in synchronism with the pixel clock. Then, the latched image density signal is corrected by the look-up table 54 in accordance with the non-linearity of the light transmittance of the light-controlling layer 1 with respect to image density. The time of voltage application to the light-controlling layer 1 which is the output from the look-up table 54 is converted by the D/A converter 56 to an analog signal indicative of a 256-level emission pulse width and the analog signal is then supplied as drive current pulses to the laser driver 42.

Figure 6:
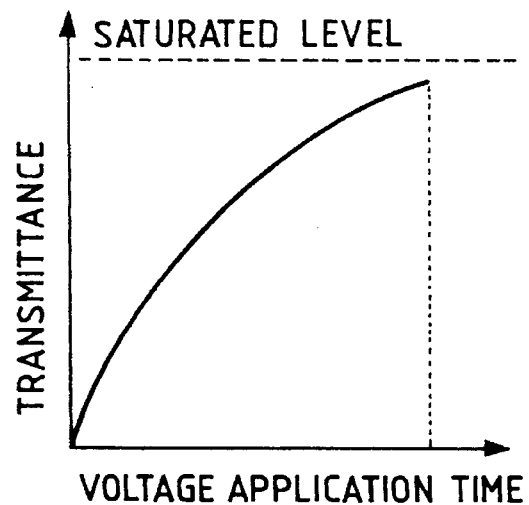
FIG. 6 is a graph showing how the relative transmittance of a light-controlling layer as indicated by 1 in FIGS. 1, 2 and 3 varies with the time of voltage application.

FIG. 6 shows how the light transmittance of the liquid crystal-polymer composite film used as light-controlling layer 1 in the example under consideration varied with the voltage application time at a peak voltage of 30 V. Since the light transmittance of the light-controlling layer 1 may be considered as a substitute characteristic for reflection image density, one can see from FIG. 6 that continuous-tone display is somewhat nonlinear with respect to the voltage application time.

Figure 7:
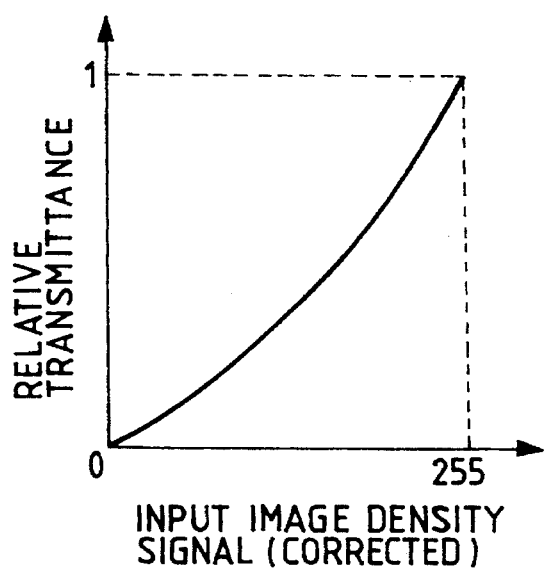
FIG. 7 is a graph showing how the voltage application time varies with an input image density signal as corrected by look-up table 54 in FIG. 5.

FIG. 7 shows how the voltage application time varies with the input image density signal that has been entered after correction by the look-up table 54.

Figure 8:
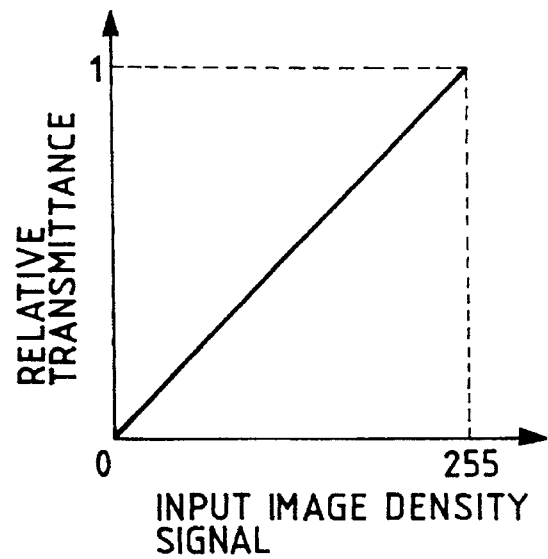
FIG. 8 is a graph showing the relationship between input image density signal and the relative transmittance of the light-controlling layer 1, as observed in the specific example of the present invention shown in FIG. 3 when using the gradation control unit having the composition shown in FIG. 5.

FIG. 8 is a graph in which the result of actual image writing by pulse width modulated exposure is shown in terms of the relationship between input image density signal and the light transmittance of the light-controlling layer. Obviously, the gradation characteristics were satisfactory and had good linearity.

In the embodiment under consideration, the photoconductive layer 2 is formed of hydrogenated amorphous silicon; it should, however, be noted that other materials may also be used, as exemplified by amorphous semiconductors (e.g., amorphous selenium, amorphous selenium tellurium, amorphous hydrogenated silicon carbide and selenium-arsenic) and cadmium sulfide.

In the embodiment under consideration, the transparent electrodes 31 and 32 are made of ITO; it should, however, be noted that other inorganic transparent materials such as $SnO_2$ may also be used. In addition, organic transparent materials such as ion-doped polyacetylene may also be used.

In the embodiment under consideration, the transparent substrate 33 is made of PET; it should, however, be noted that other organic transparent materials may be used, as exemplified by PES (polyether sulfone), polystyrene and polyimide. In addition, inorganic transparent materials such as non-alkali glass may also be used. In the embodiment under consideration, the transparent substrate 34 is made of a polyimide; it should, however, be noted that the substrate 34 may be formed of the same material as the transparent substrate 33.

In the embodiment under consideration, the gradation control unit 5 modulates the exposure time in order to control the transmission of light through the light-controlling layer 1. If desired, other factors of the output from the exposing unit 4, such as the exposing power and the number of exposing pulses, may be modulated, or controlled, to thereby control the transmission of light through the light-controlling layer 1. This approach is also capable of controlling the gradation at high speed and with good linearity. Take, for example, the case of modulating the exposing power: in this case, density information may be converted to a laser drive current and gradation is provided for the impedance of the photoconductive layer 2, so that the voltage dependency of the light transmittance of the light-controlling layer 1 is utilized to display a continuous-tone image.

In the embodiment under consideration, a laser beam scanner is used as the exposing unit 4; it should, however, be noted that other suitable devices may also be used, as exemplified by active image bars (e.g., LED array, vacuum florescent tube array, plasma array and edge-emitting EL array) and optical shutter type image bars (e.g., liquid-crystal shutter array and PLZT shutter array).

In the embodiment under consideration, the heater 6 is composed of heating electrodes; it should, however, be noted that the heater 6 may also be composed of other suitable devices, such as an electromagnetic wave generating source that applies infrared rays to the light-controlling layer 1, a heating laser light source that applies a laser beam to the light-controlling layer 1, and a microwave generating source that generates microwaves to oscillate the light-controlling layer 1, or the polymer-liquid crystal composite film.

In the embodiment under consideration, the phase transition detector 7 is composed of the combination of a light-emitting and a light-receiving element that are provided in such a way that they hold therebetween the display recording medium 100 including the light-controlling layer 1, the photoconductive layer 2, etc. It should, however, be noted that the detector 7 may also be composed of a monitor for the liquid crystal's temperature or a detector for detecting optical characteristics such as light transmittance or refractive index.

In the embodiment under consideration, the liquid crystal is heated until it assumes the liquid phase; it should, however, be noted that the liquid crystal need only be heated until it assumes the nematic phase.

In the embodiment under consideration, the carrier injection blocking layer 36 is formed of $TaO_x$; it should, however, be noted that the layer may also be formed of $SiO_2$, $TiO_2$, a-SiN, etc.

In the embodiment under consideration, the carrier injection blocking layer 37 which also serves as a light-shielding layer is formed of CdTe; it should, however, be noted that the layer 37 may also be formed of a resin having pigment or carbon black particles dispersed therein.

Next, according to the second aspect of the invention, the operation is described below with reference to FIGS. 9(a) to 9(c). Let us start the description with the image display mode including the initial image (prior to image rewriting). As shown in FIG. 9(a), a liquid crystal 103 in a liquid crystal-polymer composite film 102 in a liquid-crystal display device 101 is heated by a heating means 104 (at heating level I) so that it is maintained at a temperature higher than the temperature of the environment of use but lower than the temperature for the transition to the nematic phase, whereby it assumes the smectic A phase having memory quality. The image pattern on display is composed of light-transmitting areas and light-scattering areas as formed on the composite film 102 depending on the state of the liquid crystal's alignment that is associated with the contents of the image and, yet, the image pattern is held in the absence of an applied field. In other words, those areas of the composite film which contain vertically aligned molecules of liquid crystal are light-transmissive whereas those areas of the composite film which contain randomly aligned molecules of liquid crystal become light-scattering.

Let us then consider the case of rewriting the displayed image. As shown in FIG. 9(b), liquid crystal 103 in the interior of the liquid crystal-polymer composite film 102 is heated by the heating means 104 so that it is placed at a temperature at least equal to the temperature for the transition to the nematic phase, whereupon it makes a transition to the nematic phase (the nematic liquid crystal is indicated by 103a). Image rewriting is possible even in this state but, preferably, the liquid crystal 103 is quickly heated (at heating level II) so that it is first liquefied and then cooling by itself so that it makes a transition from the liquid to the nematic state, whereupon image rewriting is effected. This procedure enables complete erasure of the image pattern.

When all liquid crystals 103 in the composite film 102 have assumed the nematic phase (as indicated by 103a), an electric field of a pattern in accordance with rewriting image information is supplied from a voltage applying means as shown in FIG. 9(c). As a result, energized region E of the composite film 102 becomes transparent since the molecules of liquid crystal 103 are aligned vertically under the electric field; on the other hand, region N of the composite film 102 to which no electric field has been applied becomes opaque since the molecules of the liquid crystal are aligned randomly. This is the way the rewriting image pattern is formed.

In this process of image rewriting in the applied electric field, the liquid crystal 103 is further cooled by itself to make a transition to the smectic phase; however, the composite film 102 as a whole is heated by the heating means 104 (at heating level I), so that it is held at a temperature higher than the temperature of the environment of use but lower than the temperature for the transition to the nematic phase.

This is how image rewriting is done. If, in the absence of the need to effect image rewriting, the application of electric field ends, the liquid crystal still assumes the smectic phase and, hence, the last displayed image will be held as such. As a further advantage, this rewriting operation can be accomplished by activating the heating means for only a short period that is required to elevate the temperature of heating level I to a value that is at least equal to the phase transition temperature (or the temperature at which the liquid crystal makes a transition to the nematic phase); thus, image can be rewriting so fast that satisfactory results are obtained even in a case like that of moving image display where rapid rewriting is required.

The following examples in accordance with the second aspect of the invention will be described.

Figure 10:
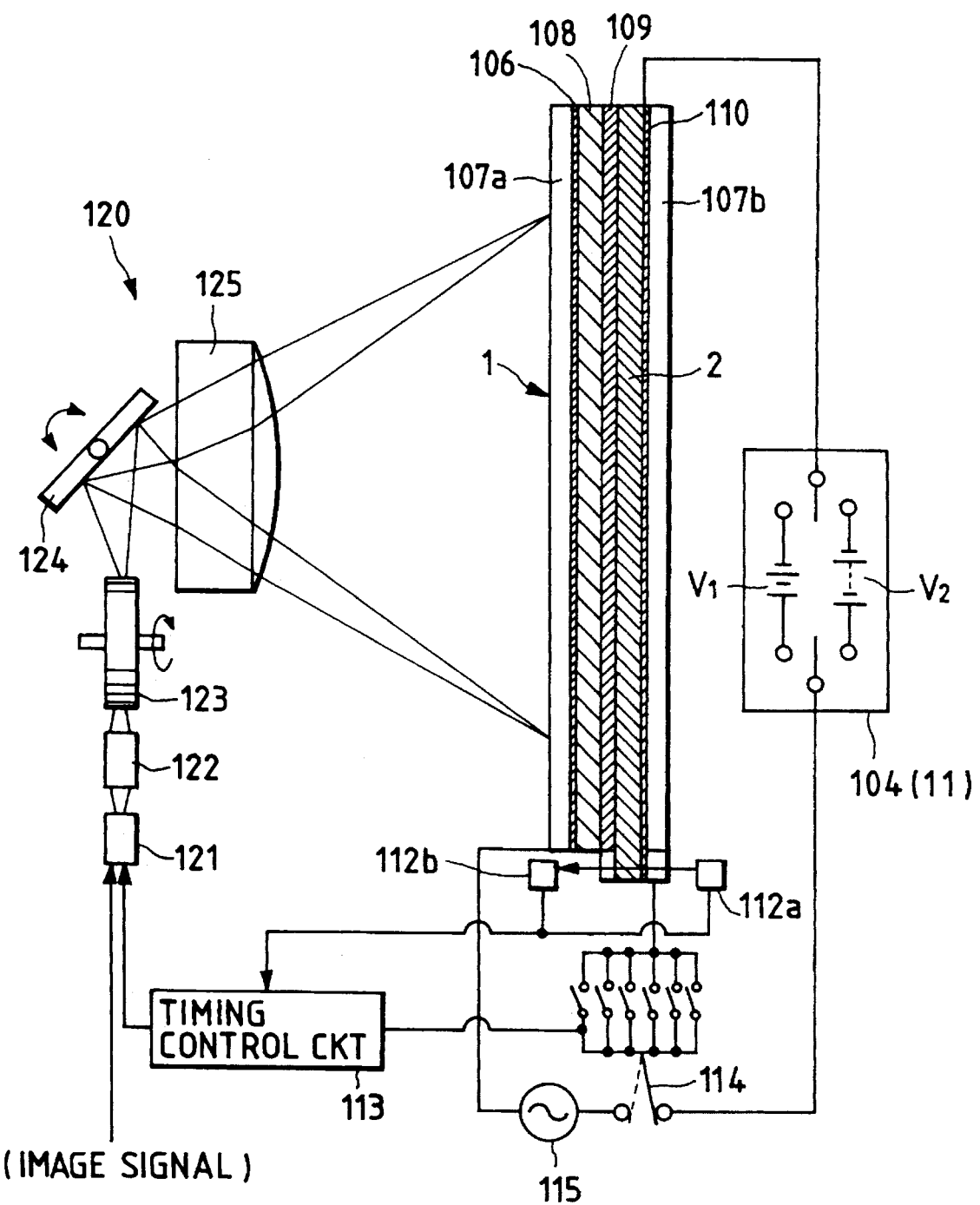
FIG. 10 is a diagram showing schematically the general layout of a liquid-crystal display apparatus according to the invention.

FIG. 10 is a diagram showing schematically the layout of a liquid-crystal image display apparatus according to an example of the present invention. Shown by reference numeral 101 in the figure is a liquid-crystal display device, which was fabricated in the following manner.

Liquid-crystal material 103 was made of a cyanobiphenyl containing smectic liquid-crystal mixture ("S2" of BDH Corp.). This liquid-crystal material (80 wt %) was blended with a polymerizable composition consisting of 11.6 wt % of 2-ethylhexyl acrylate (product of Kanto Kagaku K.K.) and 8 wt % of a urethane acrylateoligomer ("EVECURYL 204" of Daicel UCB Co., Ltd.) as compounds to be polymerized, as well as 0.4 wt % of 2-hydroxy-2-methyl-1-phenylpropane-1-one ("DAROCURE 1173" of Merck Japan Co., Ltd.) as a polymerization initiator. To the blend, glass beads with an average diameter of 8 μm ("MICROPEARL SP208" of Sekisui Fine Chemical Co., Ltd.) were added as a spacer in a small amount and the respective components were mixed in an ultrasonic cleaner, followed by degassing to prepare a mixed solution.

In a separate step, a transparent ITO electrode 6 was formed on a polyimide film substrate 107a by sputtering, and a photoconductive layer 108 and a light-shielding layer 109 were superposed on the electrode. Another transparent ITO electrode 110 that also served as a heating electrode was formed on a PET film substrate 107b by sputtering. The previously prepared mixed solution was loaded between the two substrates 107a and 107b. The photoconductive layer 108 consisted of a carrier injection blocking layer, a light-sensitive layer and another carrier injection blocking layer that were respectively formed of hydrogenated amorphous silicon nitride, boron-doped intrinsic hydrogenated amorphous silicon and hydrogenated amorphous silicon nitride in superposition in that order by a plasma-assisted CVD technique. The light-shielding layer 9 was made of CdTe. Subsequently, the assembly was held at 25° C. while it was illuminated for a few seconds with a uniform uv radiation at a wavelength of about 360 nm from a black lamp as a light source over the entire surface of the PET film so that the polymerizable composition was subjected to a curing reaction. As a result, a liquid crystal-polymer composite film 102 was formed that was composed of the loaded mixed solution and which turned uniformly turbid and opaque.

PET film 107b was furnished with heating electrodes 10 that were strips (200 μm wide) spaced apart on a pitch of 250 μm, with each electrode having a resistance of about 4 kΩ. For the purpose of heating with the heating electrodes, all of them may be supplied with voltage at the same time; alternatively, voltage may be applied to successive heating electrodes, one at a time, with the individual heating electrodes being scanned by a voltage applying electrode; by this sequential voltage application, the effect of heat accumulation in the heating electrodes can be sufficiently reduced to enable rapid temperature adjustment.

The heating electrodes 110 are furnished with a heating level switching circuit 111 and dc voltages V1 and V2 which are set at two heating levels T1 and T2 in association with different peak values of current pulses are selectively applied to the heating electrodes 110.

Stated more specifically, in a mode for image display or holding, dc voltage V1 for heating level T1 is applied to the heating electrode 110 and on account of the Joule heat as developed by the resistance of the electrode is heated to a temperature (ca. 45° C.) lower than the temperature for the transition of the liquid crystal to the nematic phase (48° C. in the case under discussion). In the image rewrite mode, the heating level is switched from T1 to T2 and dc voltage V2 for heating level T2 is applied to the heating electrode 110 and on account of the Joule heat that is developed accordingly, the composite film 102 is heated to a temperature (ca. 50° C.) that is higher than the temperature for the liquid crystal's transition to the liquid phase beyond the nematic phase (49° C. in the case under discussion).

An optical image writing unit 120 is installed adjacent the side of the liquid-crystal display device 101 which is closer to the photoconductive layer 108. The image writing unit 120 is so designed that a laser beam issuing from a semiconductor laser light source 121 in accordance with image information is collimated with a collimator 122, then deflected two-dimensionally with a polygonal mirror 123 and a galvanometer mirror 124, and finally focused by fθ focusing optics 125 to form a spot of light on the liquid-crystal display device 101.

The nonimage area of the liquid-crystal display device 101 that is solely composed of the composite film 102 and which is not supplied with electric field is equipped with an optical sensor 112 for detecting any phase transition that occurs in the liquid crystal in the composite film. The optical sensor 112 comprises a light-emitting element 112a and a light-receiving element 112b that are provided in such a way that the liquid crystal-polymer composite film 102 is positioned therebetween. As long as the liquid crystal 103 is liquefied by heating, the composite film 102 remains transparent and, hence, light from the light-emitting element 112a is kept received by the light-receiving element 112b; if the liquid crystal is cooled by itself to make a transition from the liquid to the nematic phase, the composite film 102 will become opaque, whereupon light from the light-emitting device 112a is blocked by the composite film 102 without entering the light-receiving element 112b. This difference in light reception is detected as the change in the liquid crystal's phase and the resulting detection signal is sent to a timing control circuit 113 which controls the timed relationships of the various operations to be performed by the whole assembly of the apparatus.

Figure 11:
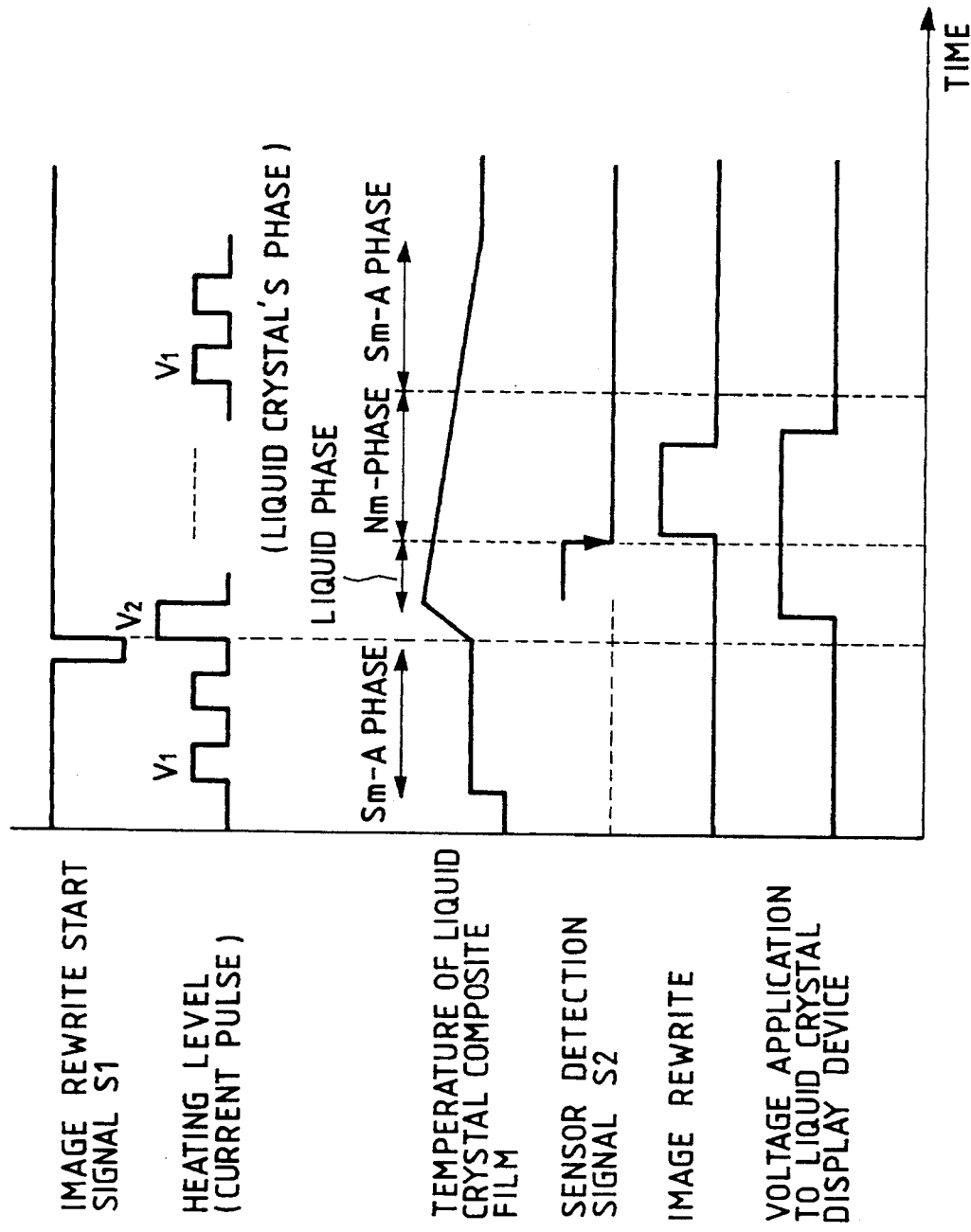
FIG. 11 is a timing chart showing the timed relationships in the driving operation of the apparatus shown in FIG. 10.

Let us then describe the drive timing for the case where the image screen is rewritten in the display apparatus according to the first example which has the construction just described above. FIG. 11 is a timing chart showing the respective operations to be performed by the apparatus.

First consider the timing just before image rewriting is started. The heating level switching circuit 111 connected to the heating means 104 supplies the heating electrodes 110 with a dc voltage V1 for the heating level T1, whereupon the liquid crystal-polymer composite film 102 is heated and held at about 45° C. higher than the temperature of the environment of use at which the liquid crystal 103 exhibits the smectic A phase (Sm-A phase). In this case, all current pulses are so set that the pulse width is about 10 ms.

Then, in accordance with image information, the timing control circuit 115 will issue a signal S1 that informs the start of image rewriting operation. As a result, the heating level switching circuit 111 with supply the heating electrodes 10 with a dc voltage V2 for the heating level T2, whereupon the composite film 102 is heated up to about 50° C. which is the temperature at which the liquid crystal is liquefied beyond the nematic phase.

If the dc voltage V2 for the heating level T2 is applied, the liquid crystal 103 is liquefied and the composite film 102 turns transparent, whereupon the optical sensor 112 is actuated. If the liquid crystal 103 cools by itself and makes a transition to the nematic phase (Nm phase), the phase change is detected with the optical sensor 112, which outputs a detection signal S2 to be sent to the timing control circuit 115; in response to this signal, the image writing operation is started. As shown in FIG. 11, the image writing operation is stated with a slight time gap (e.g. about 1 ms) from the phase-state detection signal.

Prior to this writing operation, the heating electrodes are connected to an ac power supply 115 by selective contact with the switch 114. As a result, every part of the composite film 102 is supplied with a sufficient ac voltage (50 V) to effect liquid crystal's alignment. It should, however, be noted that the ac voltage is usually applied just after the liquid crystal is liquified and the application of this voltage is such that it allows for efficient image writing.

Image writing is performed by illuminating the photoconductive layer 108 with laser light that issues from the optical image writing unit 120 in accordance with image information. Since an ac voltage is preliminarily applied between electrodes 106 and 110, an electric field associated with the optical image is applied to the composite film 102 as soon as exposure is started, whereupon the liquid crystal's alignment is controlled. The exposing operation for image writing and the application of an ac voltage are preset so that they will end before the liquid crystal makes a transition from the nematic to the smectic A phase.

By repeating these operations consecutively, image rewriting is performed cyclically. The apparatus of the example under consideration was actually operated with moving images being supplied as input from a video signal generator circuit; as it turned out, image rewriting was done for time periods of several tens to several hundred milliseconds per frame. It was also verified that the last written image was held without any change in its contents.

Figure 12:
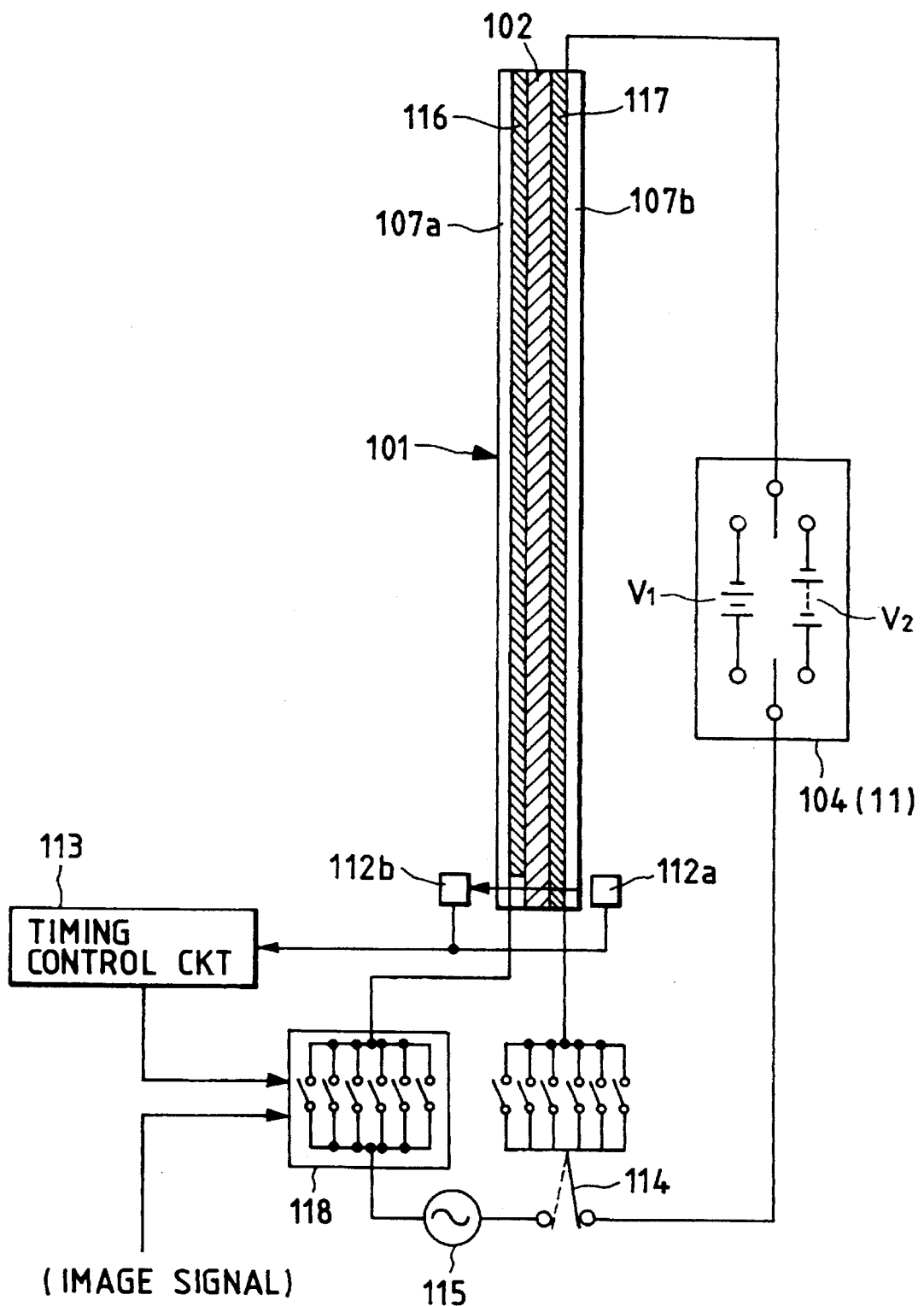
FIG. 12 is a diagram showing schematically the general layout of a liquid-crystal image display apparatus according to the invention.

FIG. 12 shows a liquid-crystal image display apparatus according to the present invention. The apparatus of this example differs from that of the previous example shown in FIG. 10 in that the image writing means comprises PET films equipped with matrix electrodes and the two examples are of the same construction in other aspects. In FIG. 12, those components which perform the same function as in the example of FIG. 10 are identified by like numerals.

Stated specifically, the apparatus of the example shown in FIG. 12 is such that the liquid-crystal display device 101 comprises the liquid crystal-polymer composite film 102 sandwiched between PET film substrates 107a and 107b that are provided with matrix electrodes 116 and 117, respectively, on the inner surface. The device is so constructed that at least one of the matrix electrodes can be used as a heating electrode (in FIG. 12, the electrode 117 is used for both heating and voltage application purposes). Shown by numeral 118 in FIG. 12 is a matrix field control circuit for applying an electric field by matrix electrodes in accordance with image information.

With the apparatus of FIG. 12 having the construction described above, image displaying and rewriting operations can be performed by the same operating theory with the same timed relationships as in the case of the apparatus of FIG. 10, except that image writing is performed by the application of an electric field from matrix electrodes 116 and 117 which are to be controlled with the matrix field control circuit 118.

A particular advantage of the apparatus of FIG. 12 is that there is no need to install an optical image writing unit of the type that is included in the apparatus of FIG. 10, and therefore, one need not provide for the space of installation of the writing unit, which gives the potential for the reduction in the overall size of the apparatus.

Figure 13:
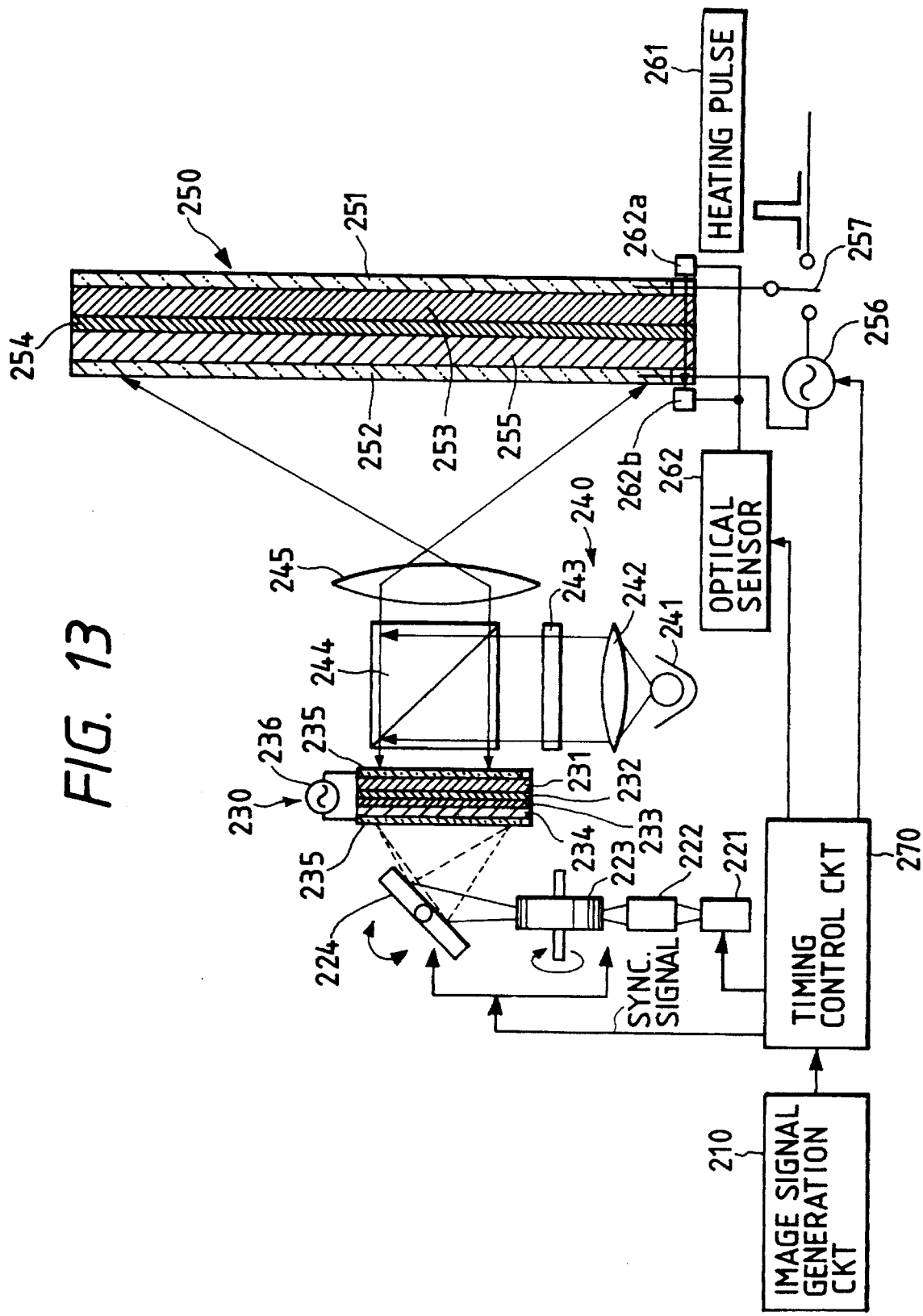
FIG. 13 is a diagram showing schematically the general layout of a liquid-crystal display apparatus according to the invention.

FIG. 13 shows a liquid-crystal display device according to still another embodiment of the invention.

In the figure, reference numeral 221 denotes a semiconductor laser which emits a light in response to an image signal produced from an image signal generation circuit 210. After the laser beam from the semiconductor laser 221 is collimated through a collimator lens 222, it is deflected two-dimensionally by a polygon mirror 223 and a galvano-mirror 224 so as to be focussed on a light modulator 230 as a beam spot. Reference numeral 210 denotes an image signal generation circuit; 270, a timing control circuit; 261, a heating pulse generator; and 262, an optical sensor.

The polygon mirror 223, for example, rotates at a speed of 36,000 rpm and has 80 faces, whereas the galvano-mirror 224 vibrates, for example, at the frequency (representative of the display frame frequency) of 20 Hz for vertically scanning.

In this embodiment, the light modulator 230 has the same structure as that used as a normally reflected liquid-crystal light valve. That is, the light modulator 230 is so constituted that a lamination of a liquid crystal layer 231 which is in the nematic phase at a room temperature, a $ZnS/MgF_2$ multi-layered reflection film 232, a CdTe light-shielding layer 233 and a photoconductive layer 234 made of CdS, which are piled up in the stated order, is interposed between a pair of glasses 235 inside which an ITO transparent electrode has been deposited. A power source 236 is connected to each of the transparent electrodes for applying a.c. voltage thereto.

The laser beam acting as an image writing light irradiates the photoconductive layer 234 of the light modulator 230. The size of the light modulator 230 is 30 mm by 21 mm, which is nearly equal to 1/10 of an A4 sheet size screen on which an image is finally displayed. Further, the beam focussed on the light modulator 230 has the spot diameter of 25 μm, and the pitch for writing is about 12 μm where the resolution is equal to 2000 DPI (Dots Per Inch).

When an image is written in the light modulator 230, while applying a.c. voltage from the power source 236, the photoconductive layer 234 is exposed by the laser beam, and the image corresponding to the laser beam is written in the liquid-crystal layer 231 with high resolution and at a high speed.

Furthermore, reference numeral 240 denotes an optical image irradiating system, and in this embodiment, the light from a high-luminance lamp (for example, a metal halide lamp in this embodiment) 241 is irradiated from a side opposite to the photoconductive layer 234 of the light modulator 230 through a half mirror 244 and a heat radiation cut filter 243 preventing a temperature from rising by allowing the light modulator 230 and a liquid-crystal cell 250 to be heated by heat radiation (infrared rays) from a condensing lens 242 or the high-luminance lamp 241. In this manner, the image held by the light modulator 230 is read as a reflected light, and after the reflected light is enlarged ten times and projected through a projection lens 245, it is focussed on the liquid crystal cell 250 being a display screen with the resolution of about 200 DPI.

Figure 14:
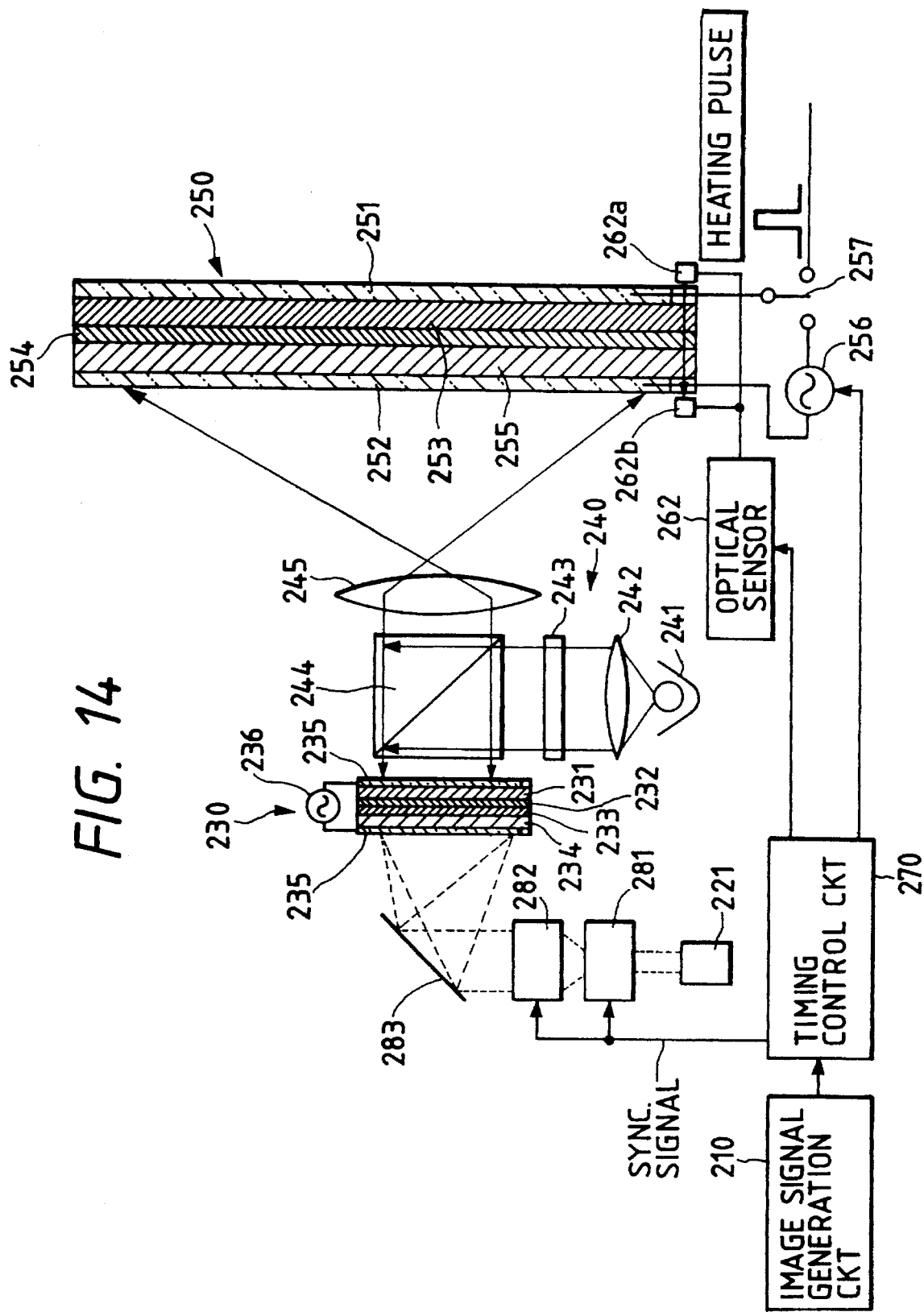
FIG. 14 is a diagram showing schematically the general layout of a liquid-crystal display apparatus according to the invention.

FIG. 14 shows still another embodiment according to the invention. The structural components similar to those in FIG. 13 are indicated by the identical reference numerals, and their description is omitted.

In the figure, since an image writing region in a light modulator 230, that is, a scanning width can be narrowed, in lieu of the mechanical scanning unit used in the emobidment of FIG. 13, two supersonic wave deflectors (X- and Y-directions) 281 and 282 are used to write output light from the supersonic wave deflectors 281 and 282 onto the light modulator 230 through a reflection mirror 283 as an image.

In this embodiment, as the supersonic wave deflectors 281 and 282, there can be used, for example, an element resulting from joining TiNbO$_3$ constituting a transducer to TeO$_2$ monocrystal (Electronic Communication Society Magazine, Vol. 154, No. 99/'71 "Recent Advance of Commentary/ Light Deflection Technique", P1266) or the like.

In the device of this type, the scanning speed is higher than the mechanical scanning, and since no mechanical parts are used, the reliability is higher than that in the embodiment of FIG. 13.

In the operation of the liquid-crystal display device of the present invention, the output light from the exposing means is modulated by the gradation control means on the basis of the information about the multi-level density of the image to be written, whereby the light transmittance of the light-controlling layer is controlled appropriately to accomplish the production of correct continuous-tone displays. Further, the impedance of the photoconductive layer is varied in accordance with the factor of modulation of the output light from the exposing means and a corresponding amount of voltage is applied to the light-controlling layer, whereby displays of high resolution can be produced.

According to the method and apparatus of the present invention for displaying liquid-crystal image, there is provided a passive display that utilizes the light scattering of a liquid crystal having high reflection contrast and which is capable of realizing fast image rewriting and convenient image holding simultaneously, which contributes satisfactory results in various operations such as the liquid-crystal display of moving images.

If image rewriting is effected at the point of time when the liquid crystal that has become once liquefied as a result of heating is cooled by itself to cause a transition to the nematic phase, image erasure can be accomplished without producing an afterimage and, in addition, faster image rewriting can be done.

If the heating means is composed in such a way that it is furnished with a heating electrode in direct contact with the liquid crystal-polymer composite film, faster image rewriting can be done with less energy consumption.

If the heating means is composed in such a way that it is furnished with a heating electrode that also serves as an electric field applying means, the apparatus can be manufactured in a smaller size or thickness and even at a lower cost.

If the heating means is furnished with a heating level switching means capable of setting a plurality of heating levels by adjusting at least one of the following parameters of the current pulses to be applied to the heating electrode, i.e., the peak value, the pulse width, and the number of pulses, the heating levels can be switched at a constant fast speed or they can be controlled in a subtle manner.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A liquid-crystal display device, comprising:
   a light-controlling layer containing at least a liquid crystal as a component, said liquid crystal exhibiting a smectic A phase at a temperature of an environment of use and making a transition to a nematic phase at a higher temperature;
   a photoconductive layer provided on one side of said light-controlling layer and the impedance of which varies in response to the light received;
   voltage applying means for applying voltage to said light-controlling layer and said photoconductive layer;
   exposing means for writing an image in said light-controlling layer by exposure of said photoconductive layer;
   gradation control means for controlling the light transmittance of said light-controlling layer by modulating the output light from said exposing means according to a signal indicative of the multi-level density of said image;
   heating means for heating said light-controlling layer until the liquid crystal in said light-controlling layer makes a transition to at least the nematic phase; and
   detecting means for outputting a detection signal upon detecting the transition of the liquid crystal in said light-controlling layer from a liquid phase to the nematic phase, exposure of said photoconductive layer being performed on the basis of said detection signal,
   said heating means stopping heating to cool said light-controlling layer to change the state of said liquid crystal from the nematic phase to the smectic A phase, whereby information written in said liquid crystal while said liquid crystal is kept in the nematic phase is kept until the state of said liquid crystal changes again to the nematic phase.

2. A liquid-crystal display device according to claim 1, wherein said light-controlling layer comprises a composite film having the liquid crystal dispersed in a polymeric resin.

3. A liquid-crystal display device according to claim 1, wherein said exposing means includes a light source capable of controlling the exposure on a pixel basis and wherein said gradation control means controls at least one of the following parameters, exposure time, exposure power and the number of exposure pulses, for each of the pixels in said photoconductive layer on the basis of said multi-level density indicative signal.

4. A liquid-crystal display device according to claim 1, wherein said heating means heats said light-controlling means until the liquid crystal in said light-controlling layer turns to the liquid phase.

5. A liquid-crystal display device according to claim 1, further comprising two carrier injection blocking layers which are provided on opposite sides of said photoconductive layer and which block the injection of carriers into said photoconductive layer.

6. A liquid-crystal display device according to claim 5 wherein one of said two carrier injection blocking layers that is provided on the side closer to said light-controlling layer also serves as a light-shielding layer that absorbs light at the wavelength of sensitivity of said photoconductive layer.

7. A liquid-crystal display device according to claim 1, further comprising a light-shielding layer that is provided between said photoconductive layer and said light-controlling layer and which absorbs light at the wavelength of sensitivity of said photoconductive layer.

8. A liquid-crystal display device according to claim 1 wherein said photoconductive layer is such that both electrons and holes are generated as carriers upon excitation by said exposure and wherein said carriers are capable of migration through said photoconductive layer.

9. A liquid-crystal display device according to claim 1 wherein said gradation control means includes correction means for correcting the nonlinearity of the light transmittance of said light-controlling layer with respect to the time over which voltage is applied to said light-controlling layer.

10. A liquid-crystal display device, comprising:
   a light-controlling layer containing at least a liquid crystal as a component;
   a photoconductive layer provided on one side of said light-controlling layer and the impedance of which varies in response to the light received;
   voltage applying means for applying voltage to said light-controlling layer and said photoconductive layer;
   exposing means for writing an image in said light-controlling layer by exposure of said photoconductive layer; and
   gradation control means for controlling the light transmittance of said light-controlling layer by modulating the output light from said exposing means according to a signal indicative of the multi-level density of said image, said gradation control means including correction means for correcting the nonlinearity of the light transmittance of said light-controlling layer with respect to the time over which voltage is applied to said light-controlling layer,
   said correction means including memory means by which the value obtained by correcting the time of voltage application to said light-controlling layer in accordance with the nonlinearity of the light transmittance of said light-controlling layer is stored in correlation to multi-level density.

11. A liquid-crystal display device according to claim 1 wherein said multi-level density indicative signal is a digital signal.

12. A liquid-crystal display device, comprising:
   a light-controlling layer containing at least a liquid crystal as a component;
   a photoconductive layer provided on one side of said light-controlling layer and the impedance of which varies in response to the light received;
   voltage applying means for applying voltage to said light-controlling layer and said photoconductive layer;
   exposing means for writing an image in said light-controlling layer by exposure of said photoconductive layer; and
   gradation control means for controlling the light transmittance of said light-controlling layer by modulating the output light from said exposing means according to a signal indicative of the multi-level density of said image,
   said multi-level density indicative signal being a digital signal, and
   said graduation means including latch means for holding said multi-level density indicative signal which is said digital signal, memory means by which the value obtained by correcting the time of voltage application to said light-controlling layer in accordance with the nonlinearity of the light transmittance of said light-controlling layer is stored as a digital signal in correlation to multi-level density and which outputs a signal indicative of said time of voltage application in response to said multi-level density indicative signal as held by said latch means, and conversion means by which the output signal indicative of said time of voltage application as delivered from said memory means is converted to an analog signal.

13. A method of displaying a liquid-crystal image, comprising the steps of:
   preparing as a liquid-crystal display device a liquid crystal-polymer composite film in which a liquid crystal that exhibits the smectic A phase at the temperature of the environment of use and which makes a transition to the nematic phase at a higher temperature is dispersed in a polymeric resin;
   in the image display mode, holding the liquid crystal in said liquid crystal-polymer composite film in the smectic A phase as it is heated by a heating means at a temperature higher than the temperature of the environment of use but lower than the temperature for the transition to the nematic phase;
   in the image rewrite mode, heating the liquid crystal by said heating means at a temperature higher than the temperature for the transition to the nematic phase; and
   at the point of time when a transition to the nematic phase occurs, applying an electric field comprising a pattern in accordance with moving image formation by an electric field applying means so as to control the state of the liquid crystal's alignment.

14. A method according to claim 13, wherein image rewriting is effected at the point of time when the liquid crystal in the liquid crystal-polymer composite film that has been once liquefied as a result of heating by the heating means is cooled by itself to cause a transition to the nematic phase.

15. An apparatus for displaying a liquid-crystal image, comprising:
   electric field applying means for applying an electrical field comprising a pattern in accordance with moving image information;
   a liquid-crystal display device furnished with a liquid crystal-polymer composite film in which the state of the liquid crystal's alignment is controlled in accordance with the applied electric field and in which a liquid crystal that exhibits the smectic A phase at the temperature of the environment of use and which makes a transition to the nematic phase at a higher temperature is dispersed in a polymeric resin;
   heating means set at a plurality of heating levels capable of heating the liquid crystal in said liquid crystal-polymer composite film to a temperature profile including a temperature higher than the temperature of the environment of use but lower than the temperature for the transition to the nematic phase, as well as a temperature higher than said temperature for the transition to the nematic phase; and
   detecting means for outputting a detection signal upon detecting the transition of the liquid crystal in said light-controlling layer from the liquid phase to the nematic phase exposure of said photoconductive layer being performed on the basis of said detection signal,
   said heating means stopping heating to cool said light-controlling layer to change the state of said liquid crystal from the nematic phase to the smectic A phase, whereby information written in said liquid crystal while said liquid crystal is kept in the nematic phase is kept until the state of said liquid crystal changes again to the nematic phase.

16. An apparatus according to claim 15, wherein the heating means can be set to at least two heating levels, one being for heating to a temperature higher than the temperature of the environment of use at which the liquid crystal in the liquid crystal-polymer composite film exhibits the smectic A phase and the other being for heating to the temperature at which said liquid crystal is once liquefied.

17. An apparatus according to claim 15 wherein said heating means is furnished with a heating electrode that is provided in contact with the liquid crystal-polymer composite film.

18. An apparatus according to claim 17, wherein said heating electrode also serves as the electric field applying means.

19. An apparatus according to claim 17, wherein said heating means has a heating level switching means for setting a plurality of heating levels by adjusting at least one of the following parameters of the current pulses to be applied to the heating electrode: the peak value, the pulse width and the number of pulses.

20. A liquid-crystal display device, comprising:

a light-controlling layer containing a liquid crystal with at least a plurality of phase states as a component;

voltage applying means for applying voltage to said light-controlling layer;

heating means for heating said light-controlling layer;

phase-state detecting means for detecting said plurality of phase states; and timing control means for determining a voltage apply timing of said voltage apply means according to a signal from said phase-state detecting means, said heating means heating said light-controlling layer until said liquid crystal makes a transition from the smectic A phase to the nematic phase, and stopping heating to cool said light-controlling layer to change the state of said liquid crystal from the nematic phase to the smectic A phase, whereby information written in said liquid crystal while said liquid crystal is kept in the nematic phase is kept until the state of said liquid crystal changes again to the nematic phase.

21. A liquid-crystal display device according to 20, wherein said phase-state detecting means detects a change of an optical characteristic of said light-controlling layer.

22. A liquid-crystal display device according to claim 20, further comprising image rewriting notifying signal generation means and wherein said timing control means controls said heating control means in synchronism with a signal from said image rewriting notifying signal generation means.

23. A liquid-crystal display device according to claim 20, wherein a slight time gap is provided between said phase-state detecting signal and said voltage applying timing.

* * * * *

UNITED STATES PATENT AND TRADEMARK OFFICE
CERTIFICATE OF CORRECTION

PATENT NO. : 5,548,420
DATED : August 20, 1996
INVENTOR(S) : Minoru KOSHIMIZU et al.

It is certified that error appears in the above-indentified patent and that said Letters Patent is hereby corrected as shown below:

Claim 21, column 26, line 13, after "according to", insert --claim--.

Signed and Sealed this

Eleventh Day of February, 1997

Attest:

BRUCE LEHMAN

Attesting Officer

Commissioner of Patents and Trademarks